United States Patent
Shum et al.

(10) Patent No.: US 9,972,775 B2
(45) Date of Patent: May 15, 2018

(54) INTEGRATED MAGNETIC RANDOM ACCESS MEMORY WITH LOGIC DEVICE HAVING LOW-K INTERCONNECTS

(71) Applicant: GLOBALFOUNDRIES Singapore Pte. Ltd., Singapore (SG)

(72) Inventors: Danny Pak-Chum Shum, Singapore (SG); Juan Boon Tan, Singapore (SG); Yi Jiang, Singapore (SG); Wanbing Yi, Singapore (SG); Francis Yong Wee Poh, Singapore (SG); Hai Cong, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days. days.

(21) Appl. No.: 15/063,544

(22) Filed: Mar. 8, 2016

(65) Prior Publication Data

US 2016/0268336 A1    Sep. 15, 2016

Related U.S. Application Data

(60) Provisional application No. 62/132,463, filed on Mar. 12, 2015.

(51) Int. Cl.
*H01L 29/82* (2006.01)
*H01L 43/12* (2006.01)
(Continued)

(52) U.S. Cl.
CPC ............ *H01L 43/12* (2013.01); *H01L 27/228* (2013.01); *H01L 43/08* (2013.01)

(58) Field of Classification Search
CPC ..... H01L 27/22; H01L 27/222; H01L 27/224; H01L 27/226; H01L 43/02; H01L 43/12
See application file for complete search history.

(56) References Cited

U.S. PATENT DOCUMENTS

| 6,611,453 B2 | 8/2003 | Ning |
| 7,001,783 B2 | 2/2006 | Costrini et al. |

(Continued)

OTHER PUBLICATIONS

Xu et al., A Breakthrough in Low-k Barrier/Etch Stop Films for Copper Damascene Applications, Mar. 2000, Semiconductor Fabtech—11th Edition, pp. 239-244.*

(Continued)

*Primary Examiner* — Syed Gheyas
(74) *Attorney, Agent, or Firm* — Horizon IP PTE Ltd.

(57) ABSTRACT

Device and methods of forming a device are disclosed. The method includes providing a substrate and a first upper dielectric layer over first, second and third regions of the substrate. The first upper dielectric layer includes a first upper interconnect level with a plurality of metal lines in the first and second regions. A MRAM cell which includes a MTJ element sandwiched between top and bottom electrodes is formed in the second region. The bottom electrode is in direct contact with the metal line in the first upper interconnect level of the second region. A dielectric layer which includes a second upper interconnect level with a dual damascene interconnect in the first region and a damascene interconnect in the second region is provided over the first upper dielectric layer. The dual damascene interconnect in the first region is coupled to the metal line in the first region and the damascene interconnect in the second region is coupled to the MTJ element.

20 Claims, 26 Drawing Sheets

(51) Int. Cl.
*H01L 43/08* (2006.01)
*H01L 27/22* (2006.01)

(56) References Cited

U.S. PATENT DOCUMENTS

| | | |
|---|---|---|
| 9,362,171 B2 | 6/2016 | Gong et al. |
| 2002/0109172 A1 | 8/2002 | Okazawa |
| 2002/0173139 A1 | 11/2002 | Kweon |
| 2003/0002330 A1 | 1/2003 | Nishimura |
| 2004/0043579 A1* | 3/2004 | Nuetzel ............... H01L 23/544 |
| | | 438/401 |
| 2004/0191928 A1 | 9/2004 | Shi |
| 2005/0242382 A1 | 11/2005 | Daughton et al. |
| 2010/0001356 A1* | 1/2010 | Kim ..................... H01L 43/12 |
| | | 257/421 |
| 2010/0184239 A1 | 7/2010 | Matsuzaki |
| 2010/0193850 A1 | 8/2010 | Asao et al. |
| 2011/0084314 A1 | 4/2011 | Or-Bach et al. |
| 2012/0007214 A1 | 1/2012 | Chu et al. |
| 2012/0135543 A1 | 5/2012 | Shin et al. |
| 2012/0314494 A1 | 12/2012 | Shuto |
| 2013/0075844 A1* | 3/2013 | Miyano ............... H01L 27/2409 |
| | | 257/421 |
| 2014/0087483 A1 | 3/2014 | Ohsawa et al. |
| 2014/0264679 A1* | 9/2014 | Lee ....................... H01L 43/12 |
| | | 257/427 |
| 2015/0311251 A1 | 10/2015 | Yi et al. |
| 2016/0064241 A1* | 3/2016 | Wu ................... H01L 21/30625 |
| | | 438/587 |
| 2016/0071905 A1 | 3/2016 | Park |

OTHER PUBLICATIONS

Davis et al. "Chapter 8: Predictive Process Design Kits", 2011, Springer, Y. Cao, Predictive Technology Model for Robust Nanoelectronic Design, Integrated Circuit and Systems.*
E. Chen et al., Advances and Future Prospects of Spin-Transfer Torque Random Access Memory, IEEE Transactions on Magnetics, Jun. 2010, pp. 1873-1878, vol. 46, No. 6, IEEE.

* cited by examiner

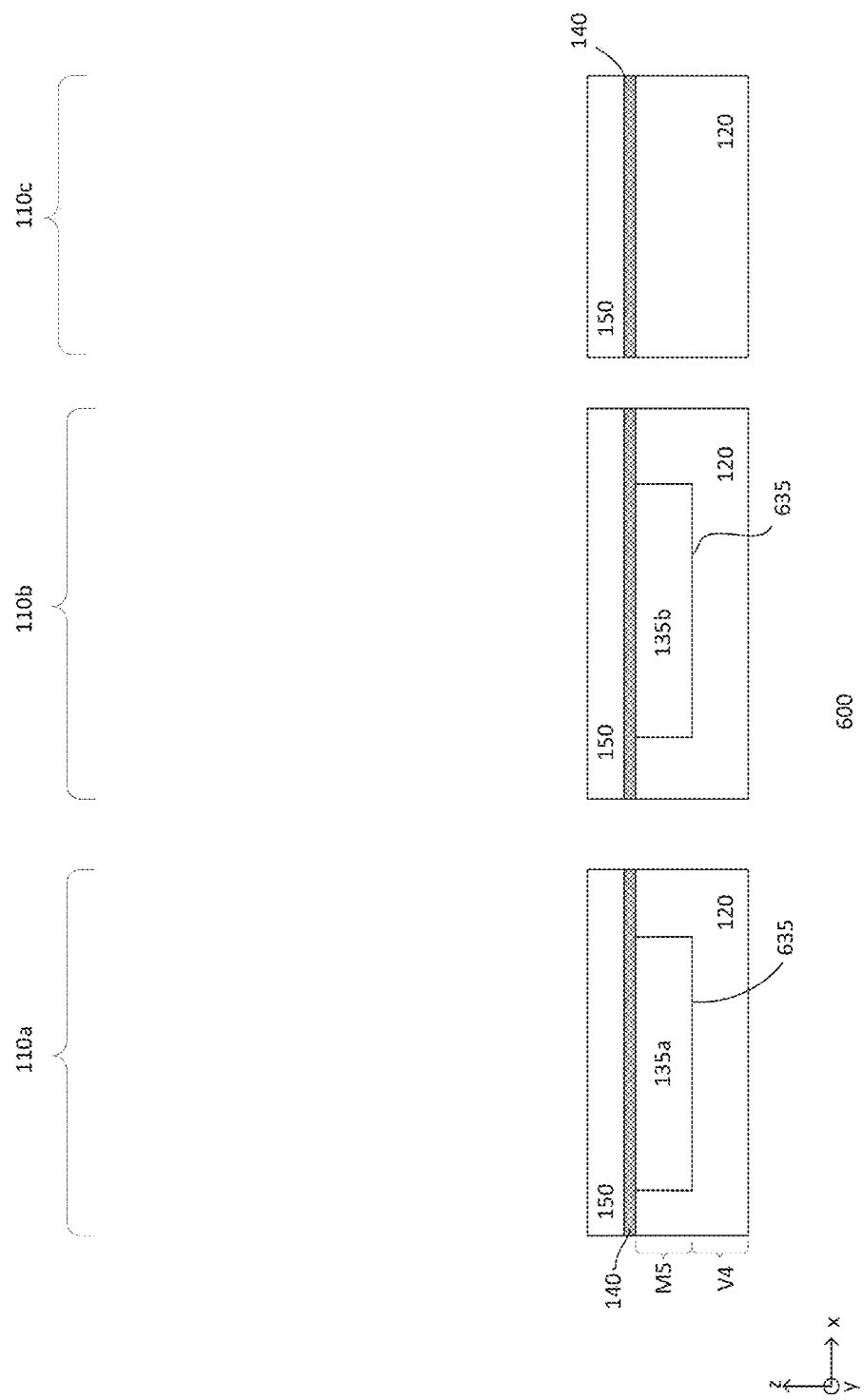

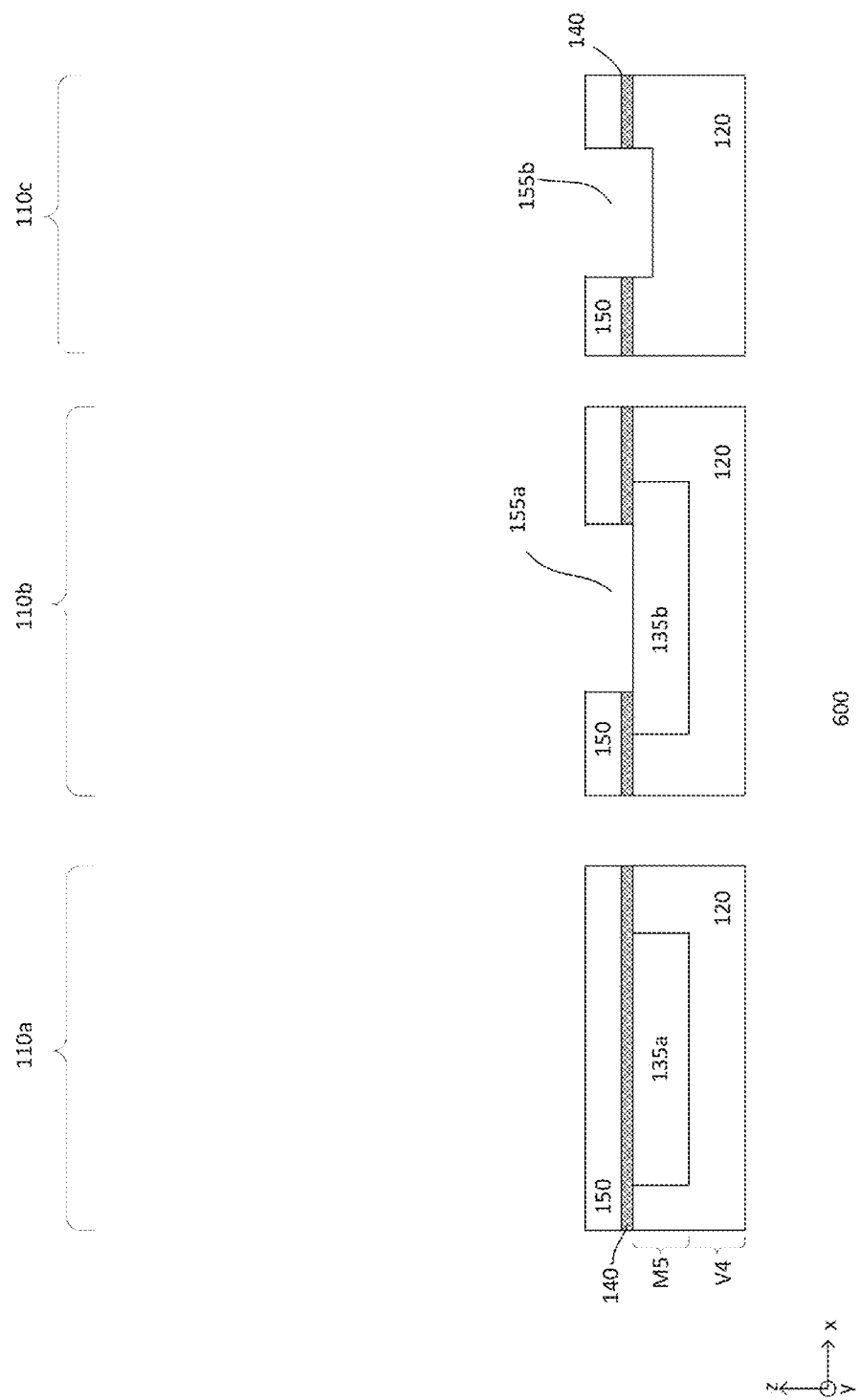

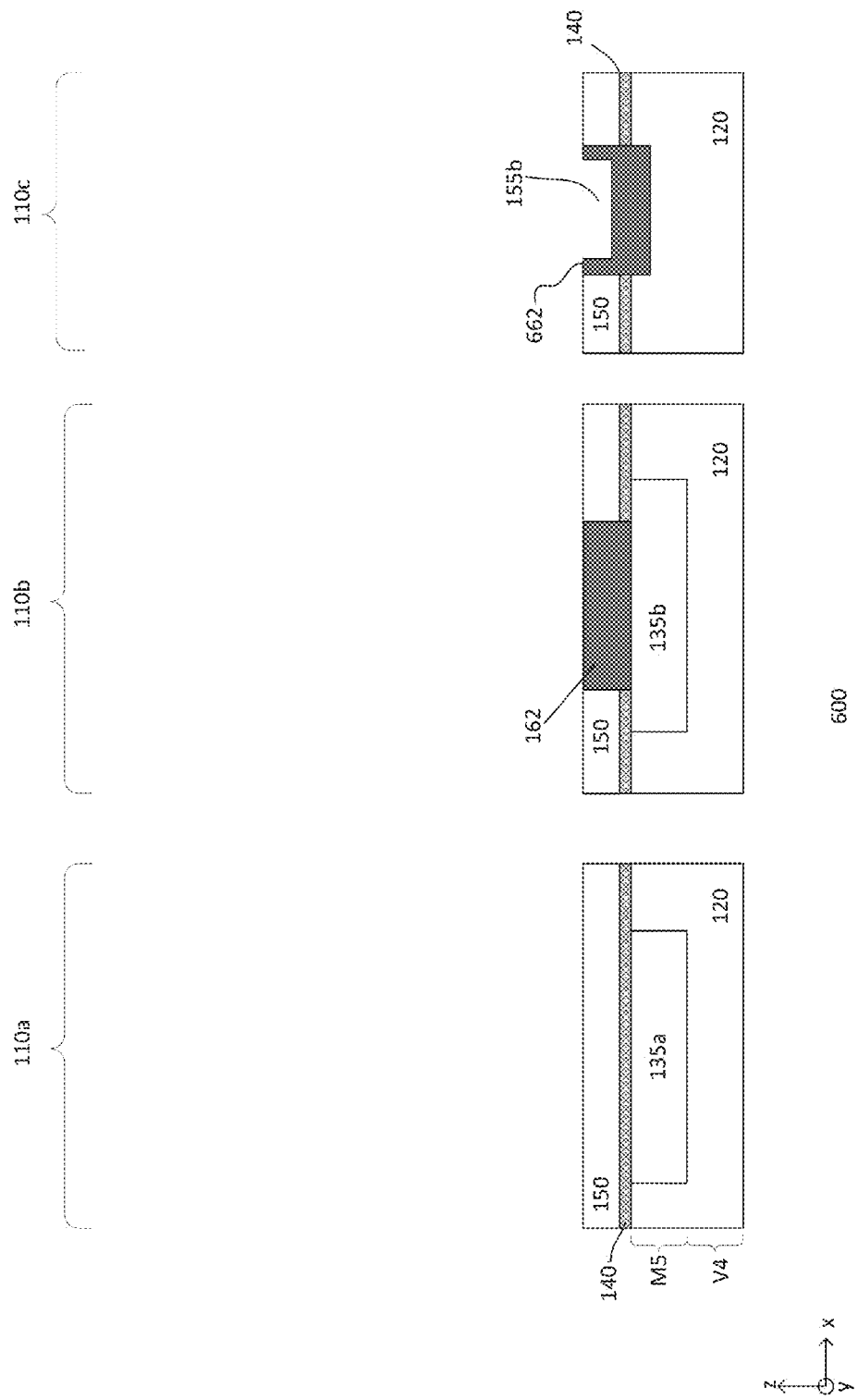

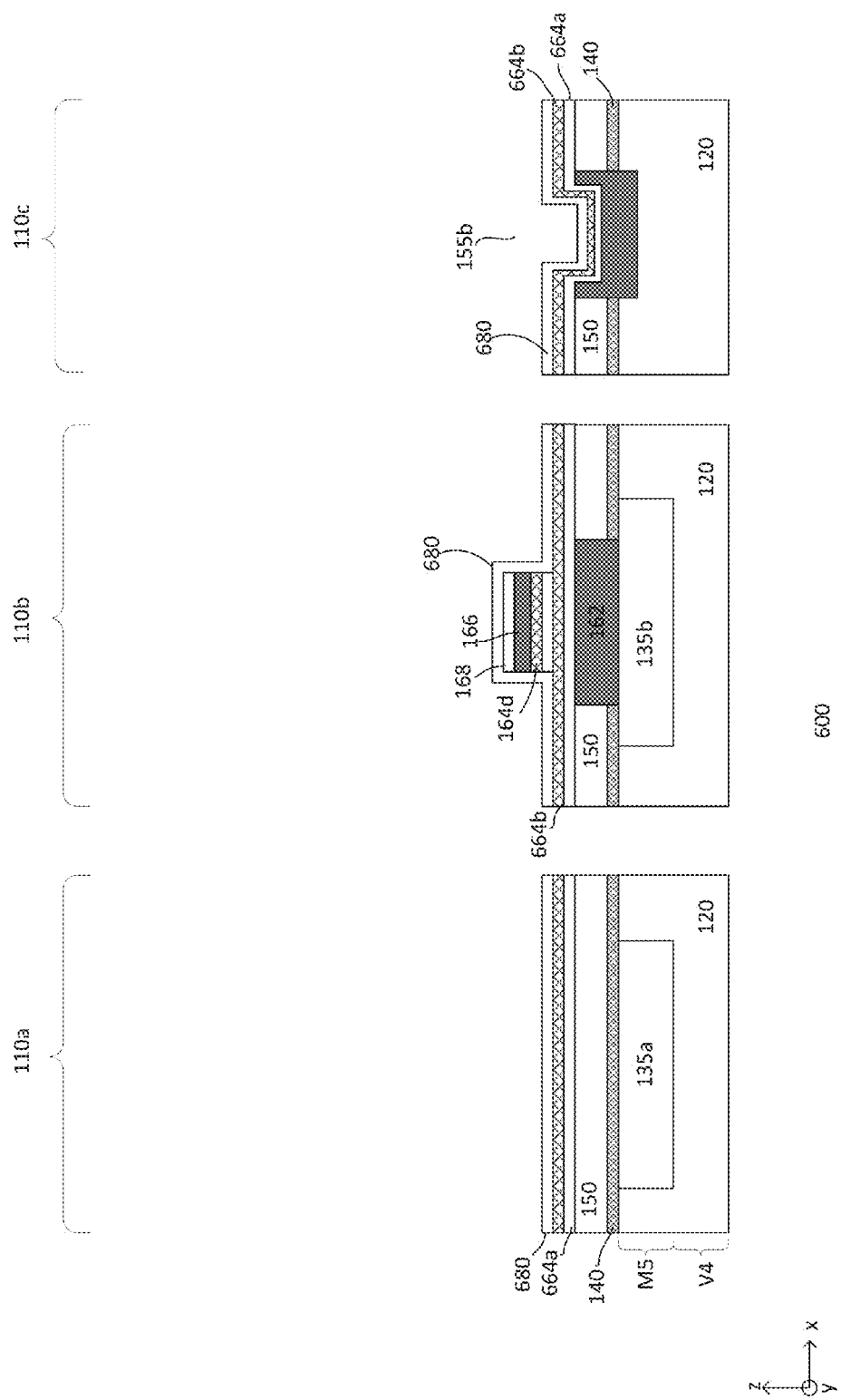

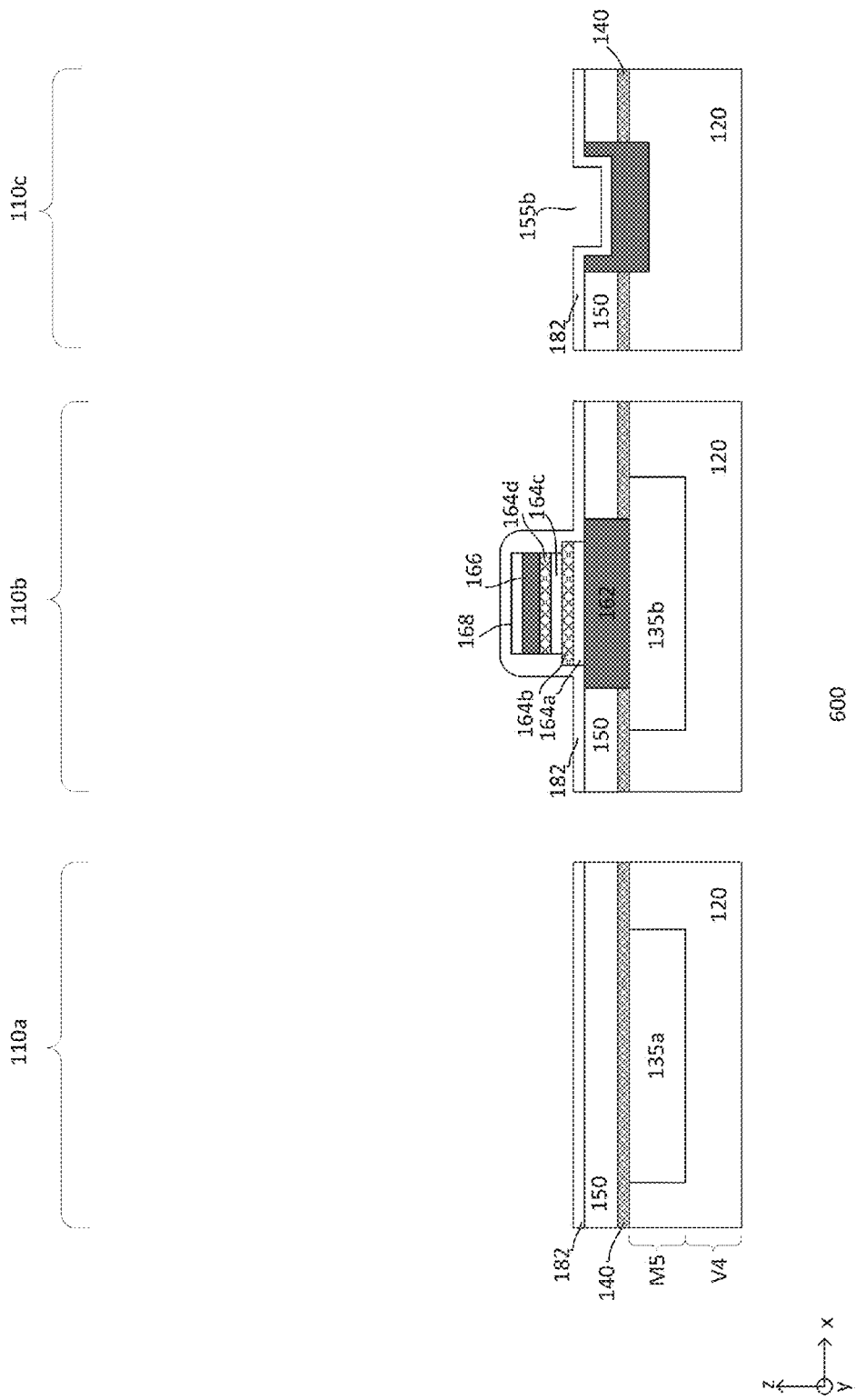

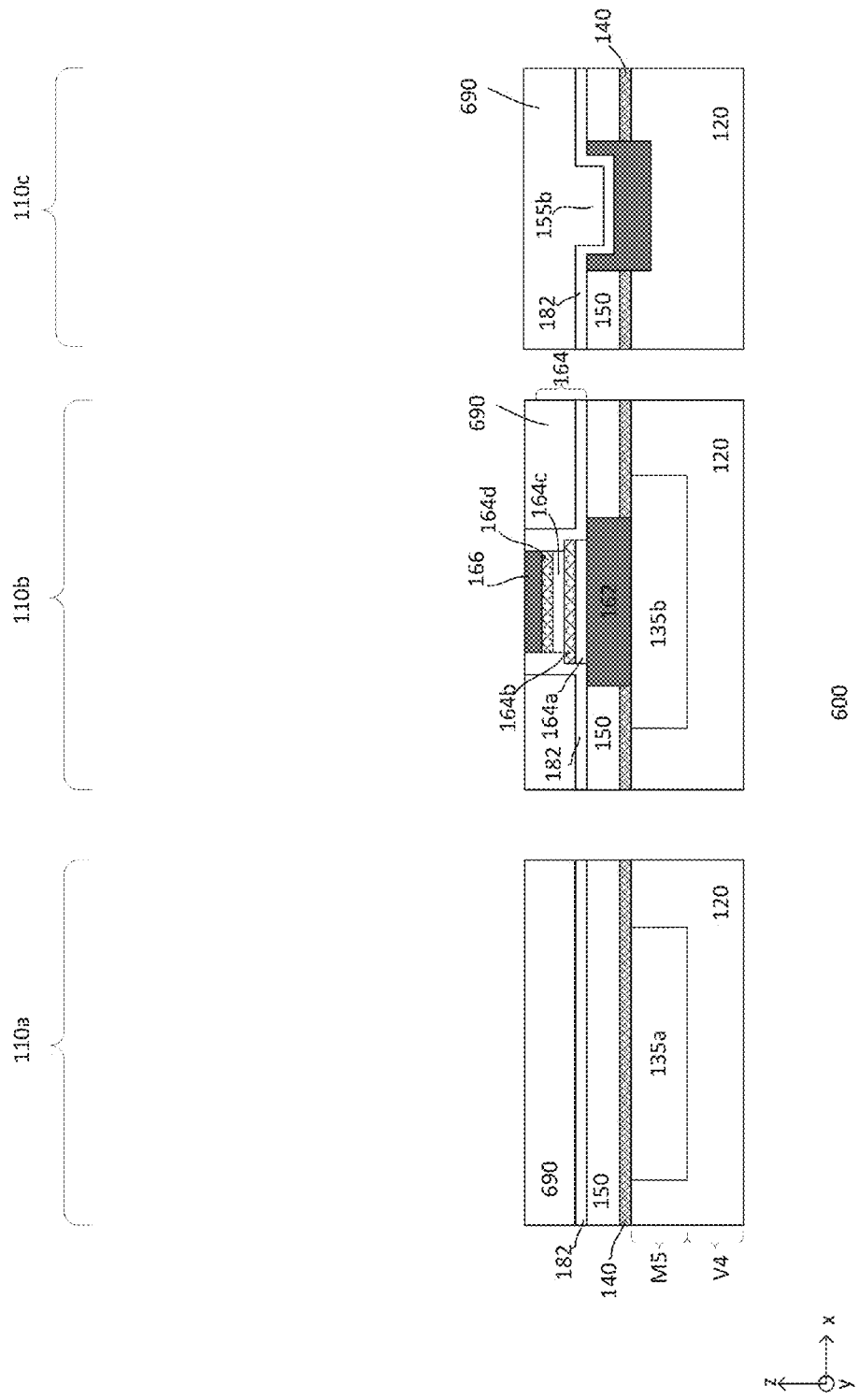

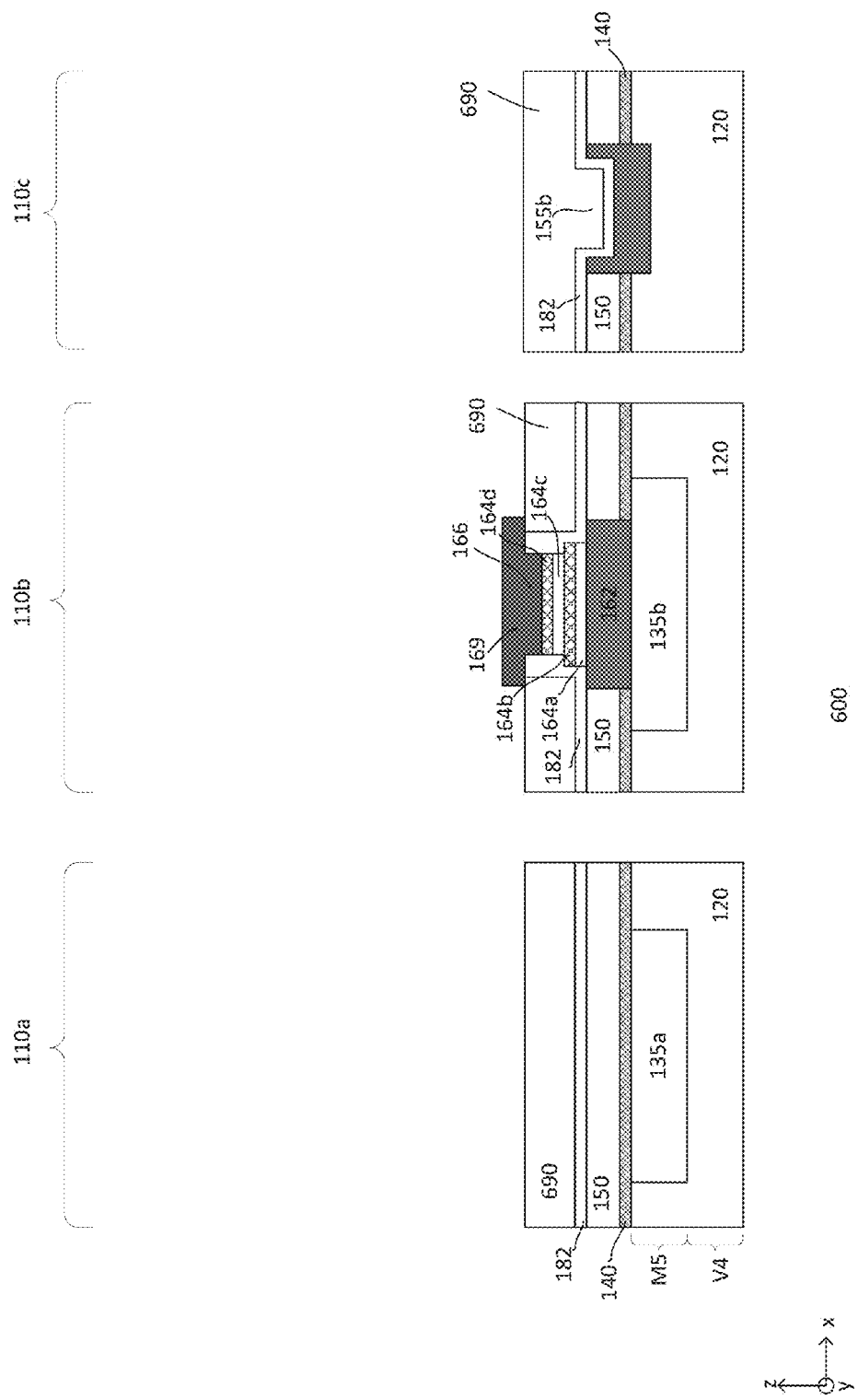

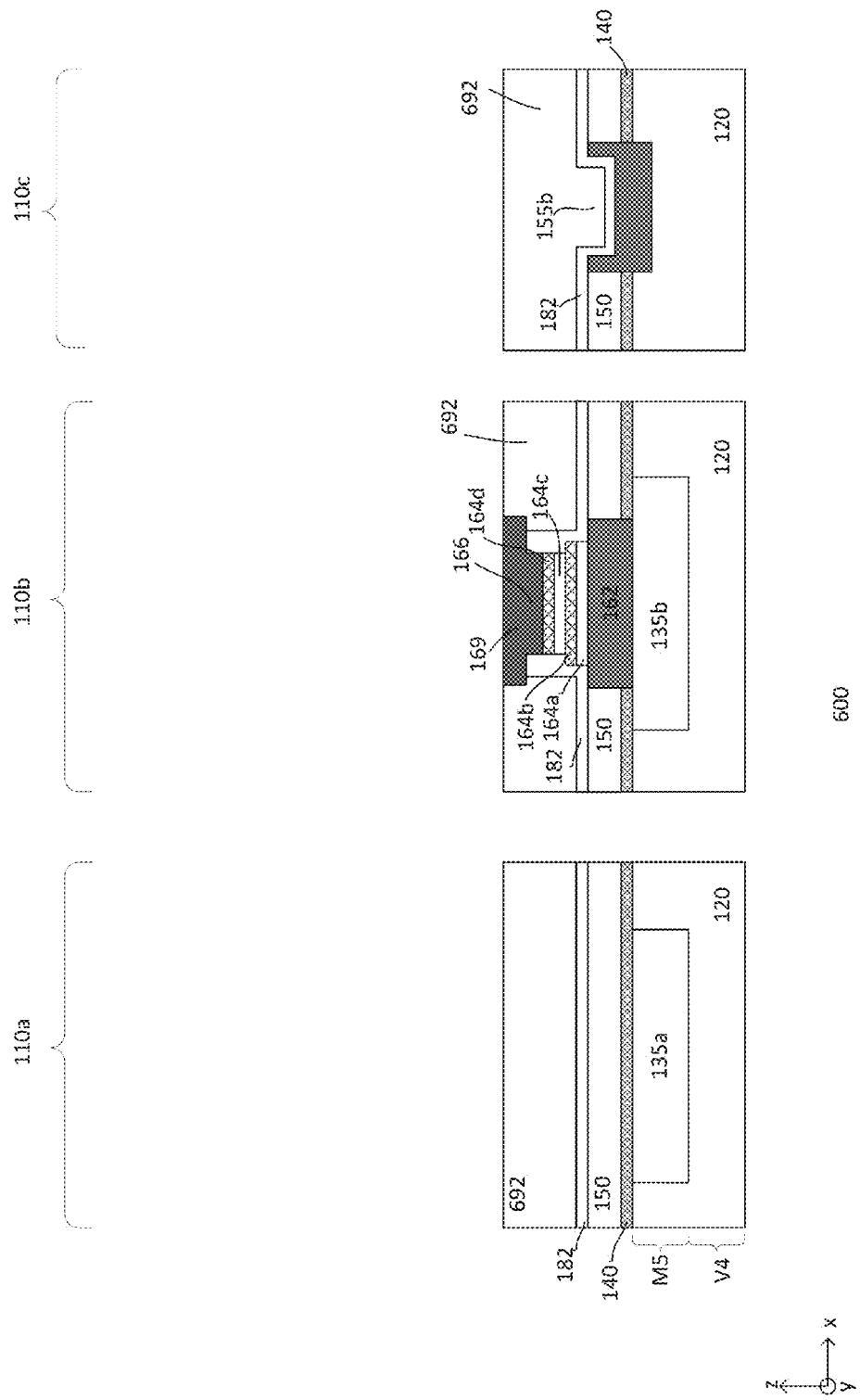

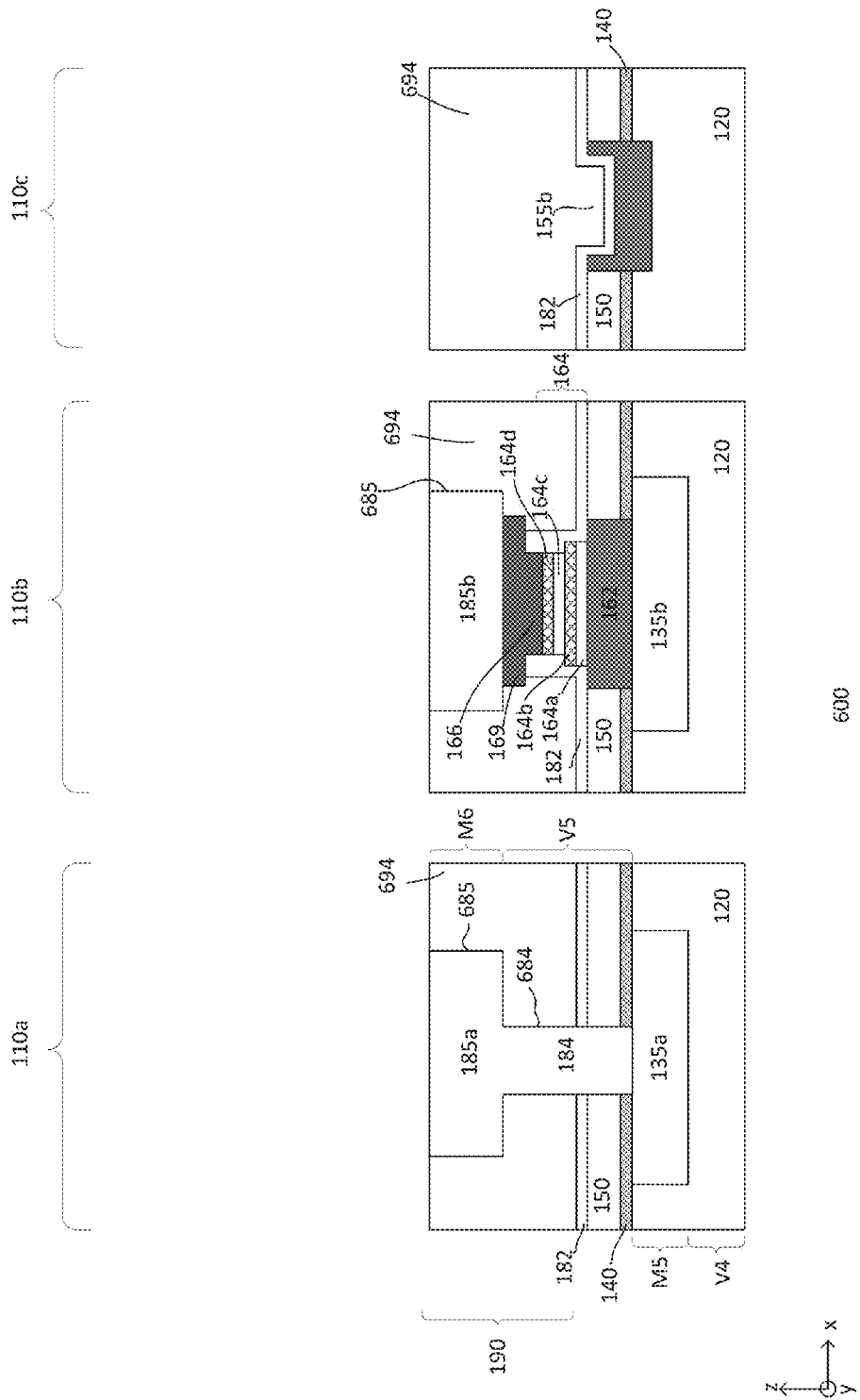

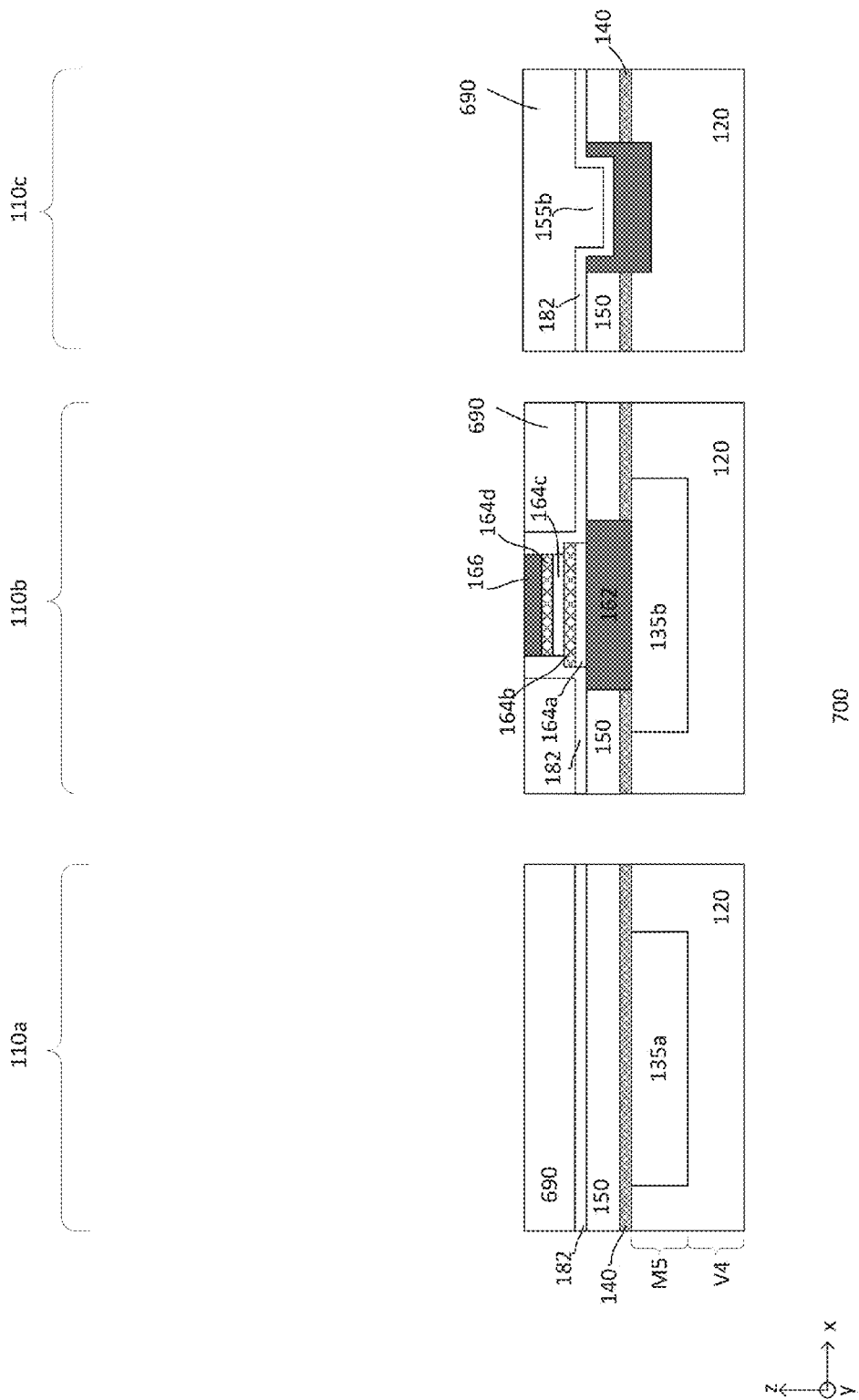

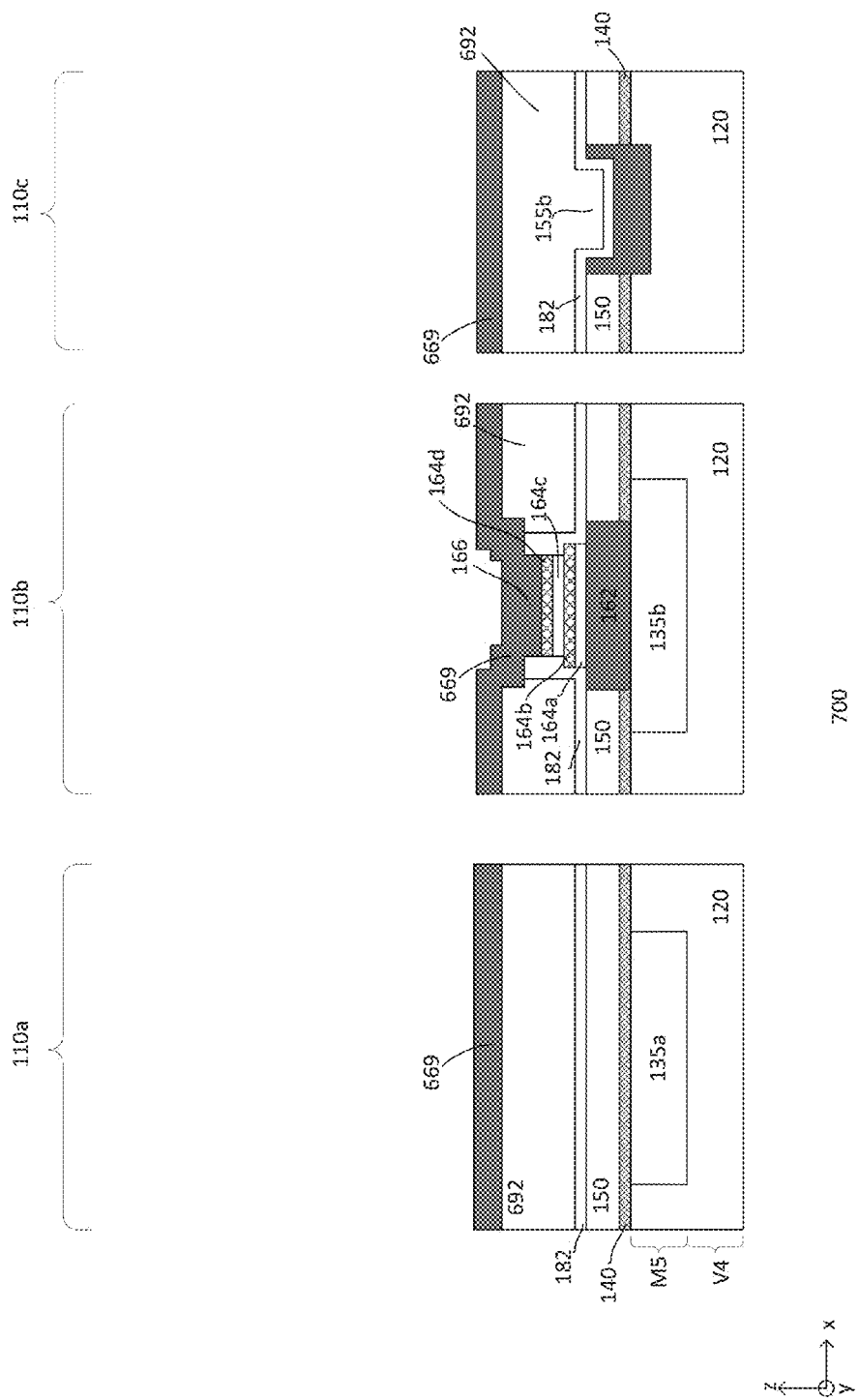

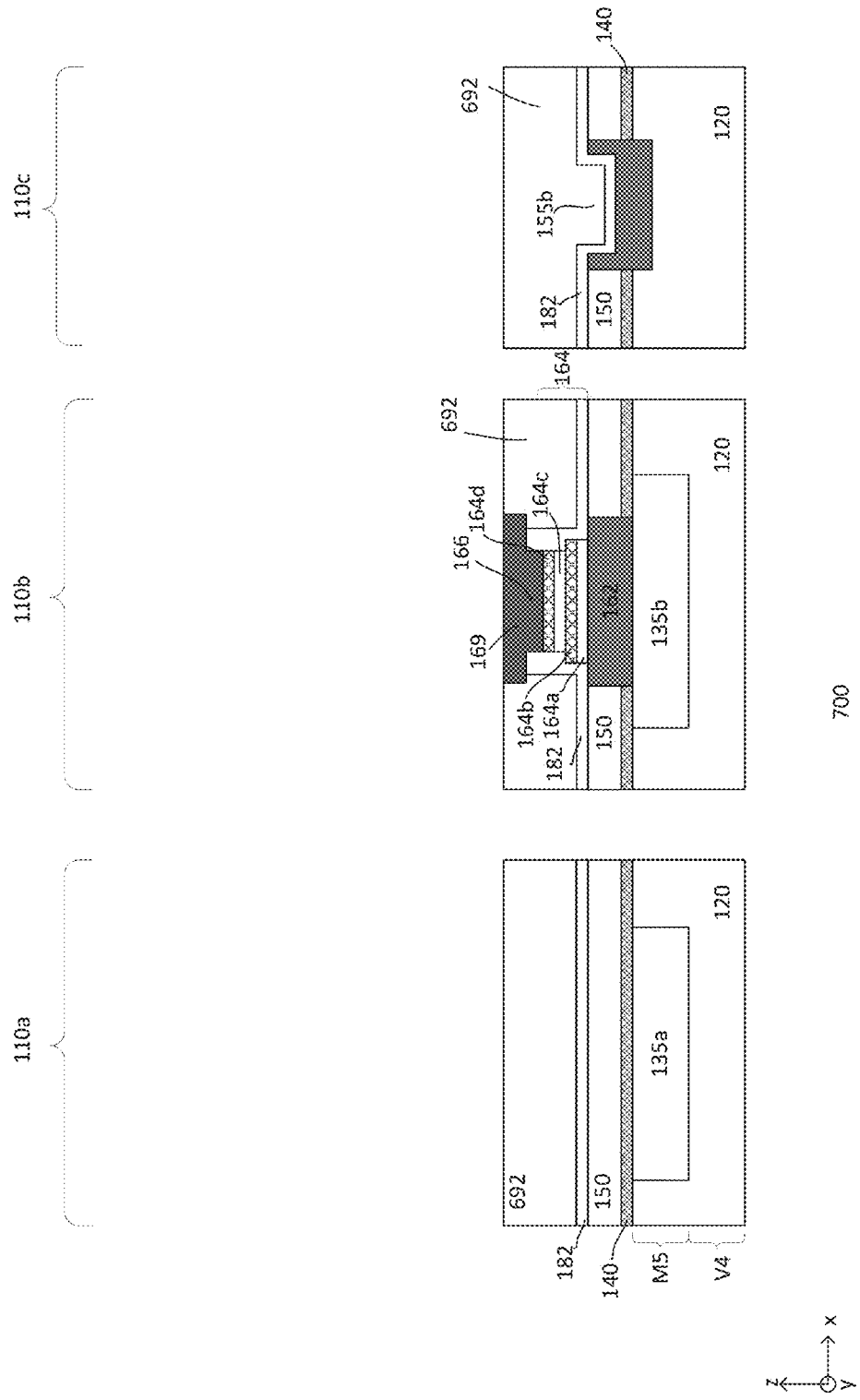

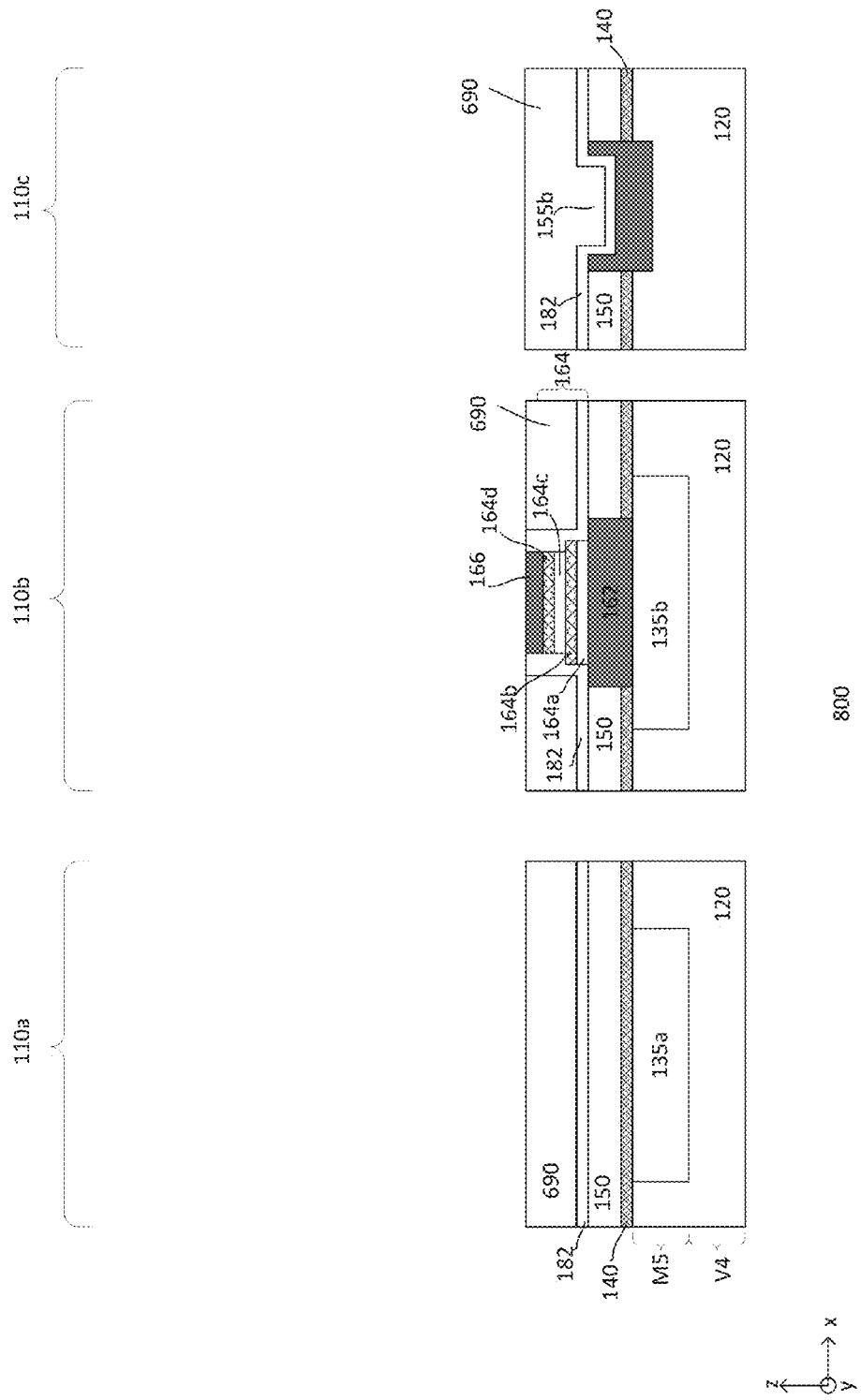

– 1 –

INTEGRATED MAGNETIC RANDOM ACCESS MEMORY WITH LOGIC DEVICE HAVING LOW-K INTERCONNECTS

CROSS-REFERENCE TO RELATED APPLICATION

This application claims the priority benefit of U.S. Provisional Application Ser. No. 62/132,463, filed on Mar. 12, 2015, which is hereby incorporated by reference in its entirety for all purposes.

BACKGROUND

Magnetic random access memory (MRAM) is a non-volatile random access memory which gains popularity in recent years as potential replacement for dynamic random access memory (DRAM), static random access memory (SRAM) and flash. MRAM, for example, includes magnetic tunnel junction (MTJ) element which uses magnetic polarization to store information. MRAM device, for example, includes MTJ stack layers having a plurality of magnetic layers. The MTJ stack layers are generally connected to interconnects in the interlevel dielectric (ILD) layer. The various MTJ stack layers, however, are not transparent to light. Thus, when the various MTJ stack layers are patterned using lithography and etch techniques, the patterned MTJ stack layers may not be aligned to the underlying interconnect structures due to non-transparent metal layers of the MTJ stack and thus fail to couple to the underlying interconnect structures. This may render the MRAM device inoperable. Moreover, MRAM cells are commonly integrated with various other logic gates and electronic components such as transistors, capacitors, metal wires, etc., in the development of memory devices. Accordingly, it is desirable that the process of manufacturing MRAM cell to be highly compatible with logic processing and it is also desirable to provide a method that reduces the number of masks involved for integrating MRAM components with logic devices having low-k interconnects into a single chip or IC in a reliable, simplified and cost effective way.

SUMMARY

Embodiments of the present disclosure generally relate to semiconductor device and methods for forming a semiconductor device. In one aspect, a method for forming a device is disclosed. The method includes providing a substrate defined with at least first, second and third regions. A first upper dielectric layer is provided over the first, second and third regions of the substrate. The first upper dielectric layer includes a first upper interconnect level with a plurality of metal lines in the first and second regions. A magnetic random access memory (MRAM) cell is formed in the second region. The MRAM cell includes a magnetic tunnel junction (MTJ) element sandwiched between top and bottom electrodes over the first upper dielectric layer. The bottom electrode is in direct contact with the metal line in the first upper interconnect level of the second region. A dielectric layer is provided over the first, second and third regions and covering the first upper dielectric layer. The dielectric layer includes a second upper interconnect level with a dual damascene interconnect in the first region and a damascene interconnect in the second region. The dual damascene interconnect in the first region is formed over and is coupled to the metal line in the first region and the damascene interconnect in the second region is coupled to the MTJ element.

In another aspect, a device is disclosed. The device includes a substrate defined with at least first, second and third regions. A first upper dielectric layer is disposed over the first, second and third regions of the substrate. The first upper dielectric layer includes a first upper interconnect level with a plurality of metal lines in the first and second regions. A magnetic random access memory (MRAM) cell is disposed in the second region. The MRAM cell includes a magnetic tunnel junction (MTJ) element sandwiched between top and bottom electrodes over the first upper dielectric layer. The bottom electrode is in direct contact with the metal line in the first upper interconnect level of the second region. A dielectric layer is disposed over the first, second and third regions and covering the first upper dielectric layer. The dielectric layer includes a second upper interconnect level with a dual damascene interconnect in the first region and a damascene interconnect in the second region. The dual damascene interconnect in the first region is disposed over and is coupled to the metal line in the first region and the damascene interconnect in the second region is coupled to the MTJ element.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIGS. 6a-6m show cross-sectional views of an embodiment of a process for forming a device;

FIGS. 7a-7d show cross-sectional views of another embodiment of a process for forming a device; and FIGS. 8a-8b show cross-sectional views of yet another embodiment of a process for forming a device.

DETAILED DESCRIPTION

Embodiments of the present disclosure generally relate to integration of memory device with logic device in an integrated circuit (IC) with reduced number of masks. The memory device, for example, may be spin transfer torque magnetic random access memory (STT-MRAM) device. The memory device includes memory cell having MTJ element. Other suitable types of memory devices may also be useful. Such memory device together with logic components are generally based on any suitable technology node (including but not limited to 28 nm technology node) where low-k dielectric layers are used in back-end-of-line (BEOL) processing. Low-k dielectric layer reduces parasitic capacitance, enabling faster switching speeds and lowers heat dissipation and is favorable as devices continue to scale down further. The memory device together with the logic components can be incorporated into standalone memory devices including, but not limited to, USB or other types of portable storage units, or ICs, such as microcontrollers or system on chips (SoCs). The devices or ICs may be incorporated into or used with, for example, consumer electronic products, or relate to other types of devices.

Figure 1:
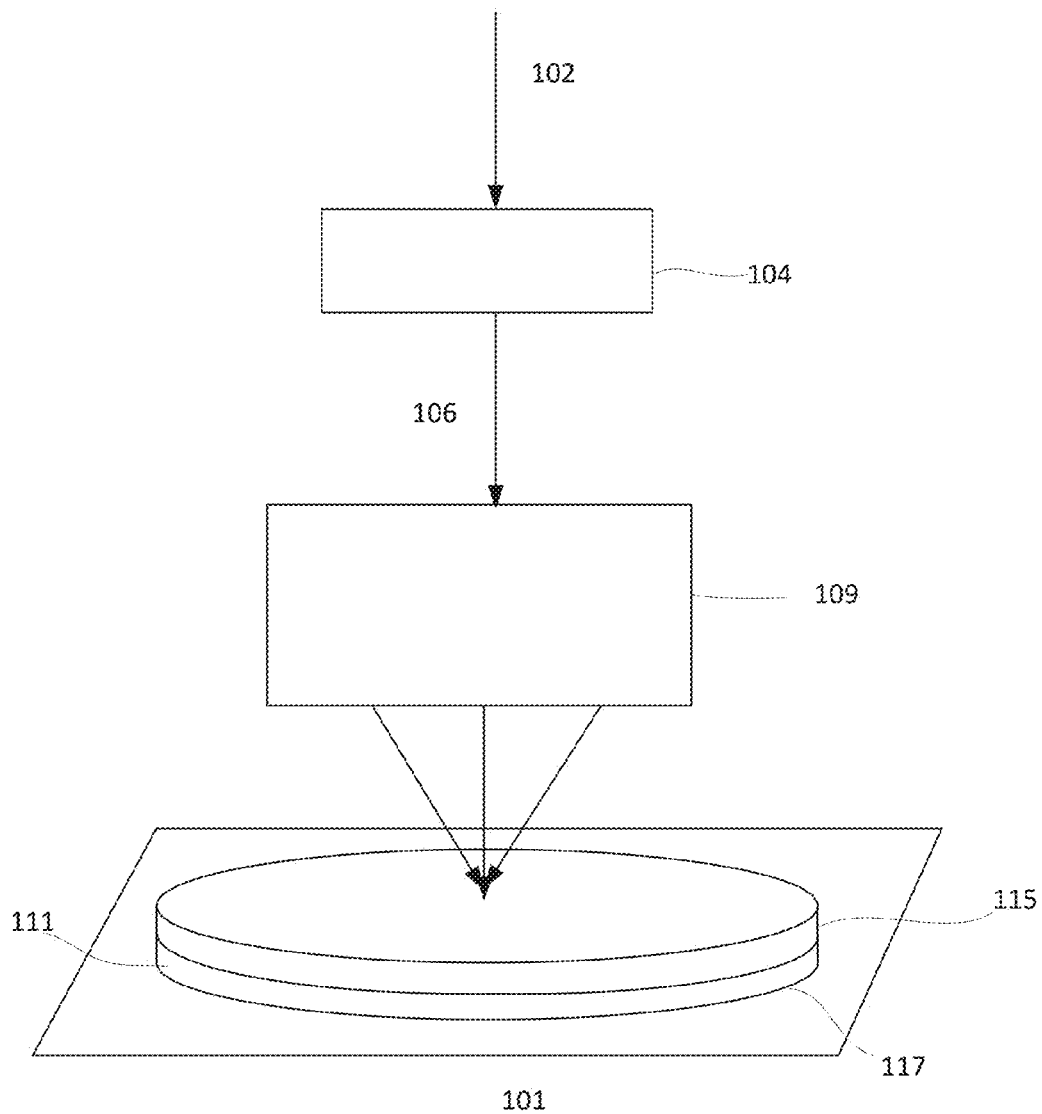
FIG. 1 shows a simplified diagram of a portion of an exemplary lithography system.

FIG. 1 shows a simplified portion of an exemplary photolithography system 101 used for patterning a wafer to form features, such as circuit components. The photolithography system may include, for example, exposure, beam shaping and illumination sub-systems (not shown). The exposure sub-system, for example, includes an exposure source for generating electromagnetic radiation (EMR). In one embodiment, the EMR is used in extreme ultra-violet (EUV) lithography. The EMR is passed through the beam shaping sub-system, which may include a collimator and monochromator to prepare an EMR beam (e.g., EMR operating beam).

The EMR operating beam is passed through the illumination sub-system. The illumination sub-system, for example, may include mirrors and/or lenses. The illumination sub-system conducts the EMR operating beam 102 to a mask or reticle 104 having a desired pattern (e.g., mask pattern).

In one embodiment, the reticle is a transmissive reticle. For example, the reticle transmits the EMR operating beam through it. The transmitted EMR beam 106 is a patterned beam having the pattern of the reticle. Other types of reticles, such as reflective reticles, can also be employed. For example, the reflective reticle reflects the EMR operating beam, creating a reflected patterned beam.

The patterned beam is projected onto the wafer 111. In one embodiment, the wafer is disposed on a translation stage 117. In one embodiment, the patterned beam is projected onto the wafer by a projection sub-system 109. The projection sub-system may include mirrors and/or lenses for projecting the patterned beam onto a portion of the wafer. The wafer includes a photoresist layer 115 which is exposed by the patterned beam. For example, the image of the patterned beam is imaged onto the photoresist layer. The patterned beam exposes a portion of the wafer with the image of the reticle. The exposed portion corresponds to a device region on which a device is formed. After exposing the portion, the stage may be translated to expose a next portion of the wafer. The exposure process repeats until the complete wafer is exposed. Processing a wafer using other types of lithographic or printing systems may also be useful.

After the wafer has been exposed, the photoresist is developed, transferring the pattern of the reticle to the resist layer. An anti-reflective coating (ARC) may be provided beneath the resist layer to improve lithographic resolution. The patterned resist layer serves as an etch mask. For example, an anisotropic etch, such as a reactive ion etch (RIE), patterns the wafer using the etch mask. Depending on the stage of process, the etch may etch a bare wafer, a layer on the wafer, or multiple layers on the wafer.

After processing of the wafer is completed, the wafer is diced along the scribe lane or dicing channel to produce individual dies. The dies may be processed to include package bumps. For example, wafer level packaging may be performed prior to dicing the wafer. The dies may be packaged and mounted onto an external component, such as a package substrate or a circuit board.

Figure 2:
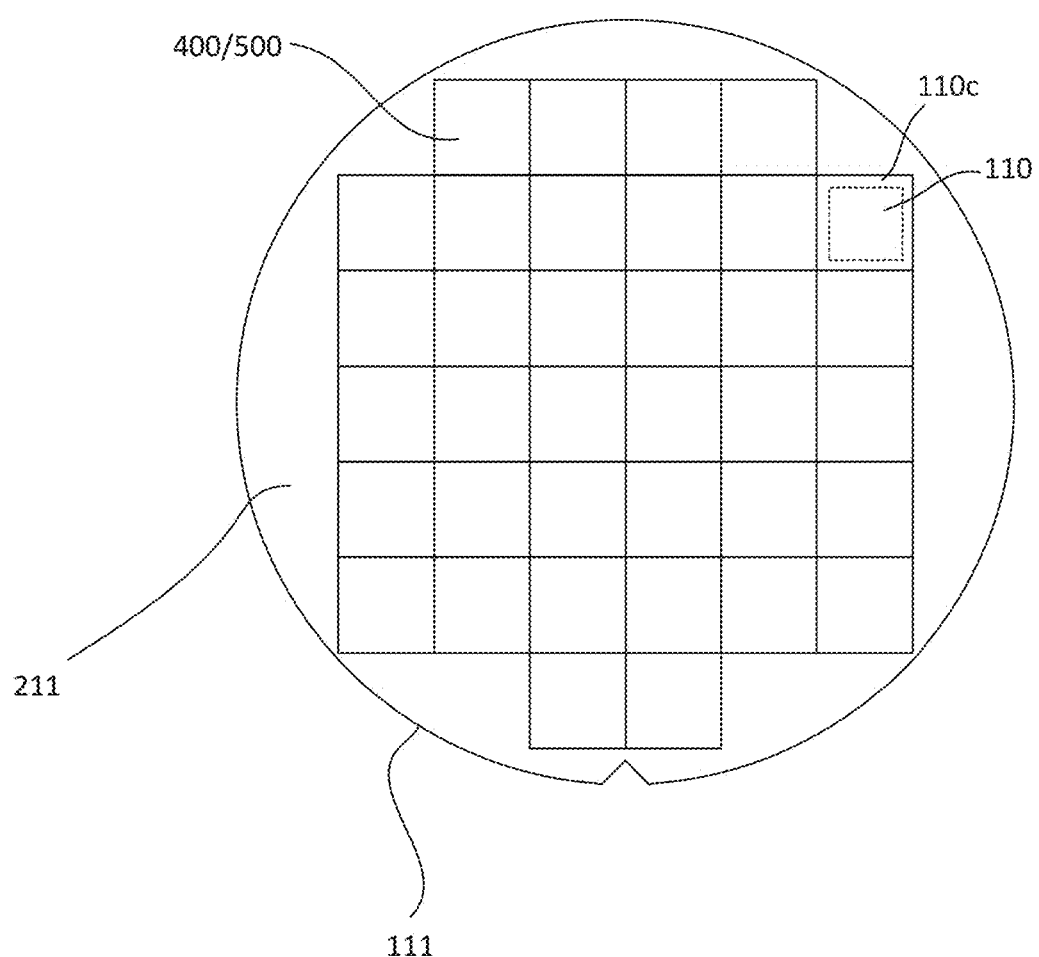
FIG. 2 shows a simplified plan view of a portion of an embodiment of a semiconductor wafer.

FIG. 2 shows a simplified plan view of a portion of an embodiment of a semiconductor wafer 111. The semiconductor wafer, for example, may be a silicon wafer. Other types of wafers are also useful. For example, the wafer may be a p-type or n-type doped wafer.

The wafer includes a surface 211 on which a plurality of devices 400/500 are formed. The plurality of devices may be formed on the wafer in parallel. The devices, for example, are arranged in rows along a first (x) direction and columns along a second (y) direction. A device, as shown, includes a main device region 110 and a frame or perimeter region 110c. The main device region includes features and interconnections of the die. As for the perimeter region, it surrounds the main device region. The perimeter region, for example, serves as the scribe lanes or dicing channels 110c on the wafer, separating adjacent devices. The devices are singulated by dicing the wafer along the scribe lanes or dicing channels.

Figure 3:
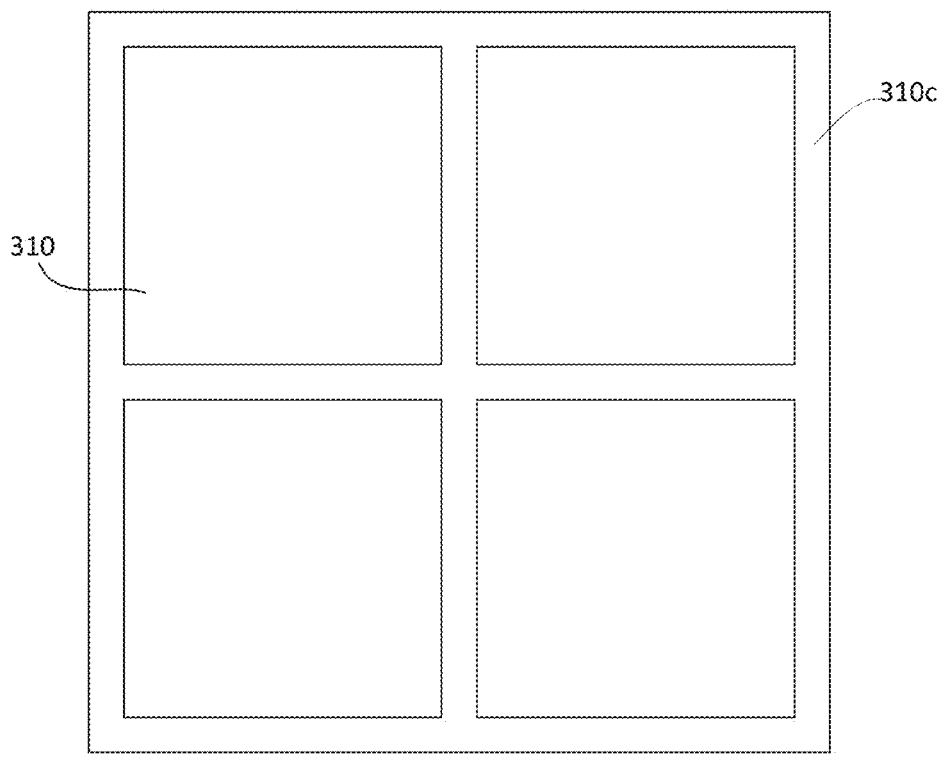
FIG. 3 shows a simplified plan view of an embodiment of a portion of a reticle used in exposing a wafer.

FIG. 3 shows an embodiment of a portion of the reticle 104 used in exposing the wafer 111. As shown, the reticle includes prime or main regions 310. The main region, for example, may be referred to as the device region. The device region includes a pattern which, for example, corresponds to the pattern to be formed in the device. The reticle creates patterns of devices in the main device regions on the wafer. A frame region 310c surrounds the device region. The frame region, for example, corresponds to perimeter regions or scribe lanes on the wafer. The frame region surrounds the devices on the wafer. The reticle is used to create desired patterns for respective levels on the device. In forming the dies, several reticles may be employed.

Figure 4A:
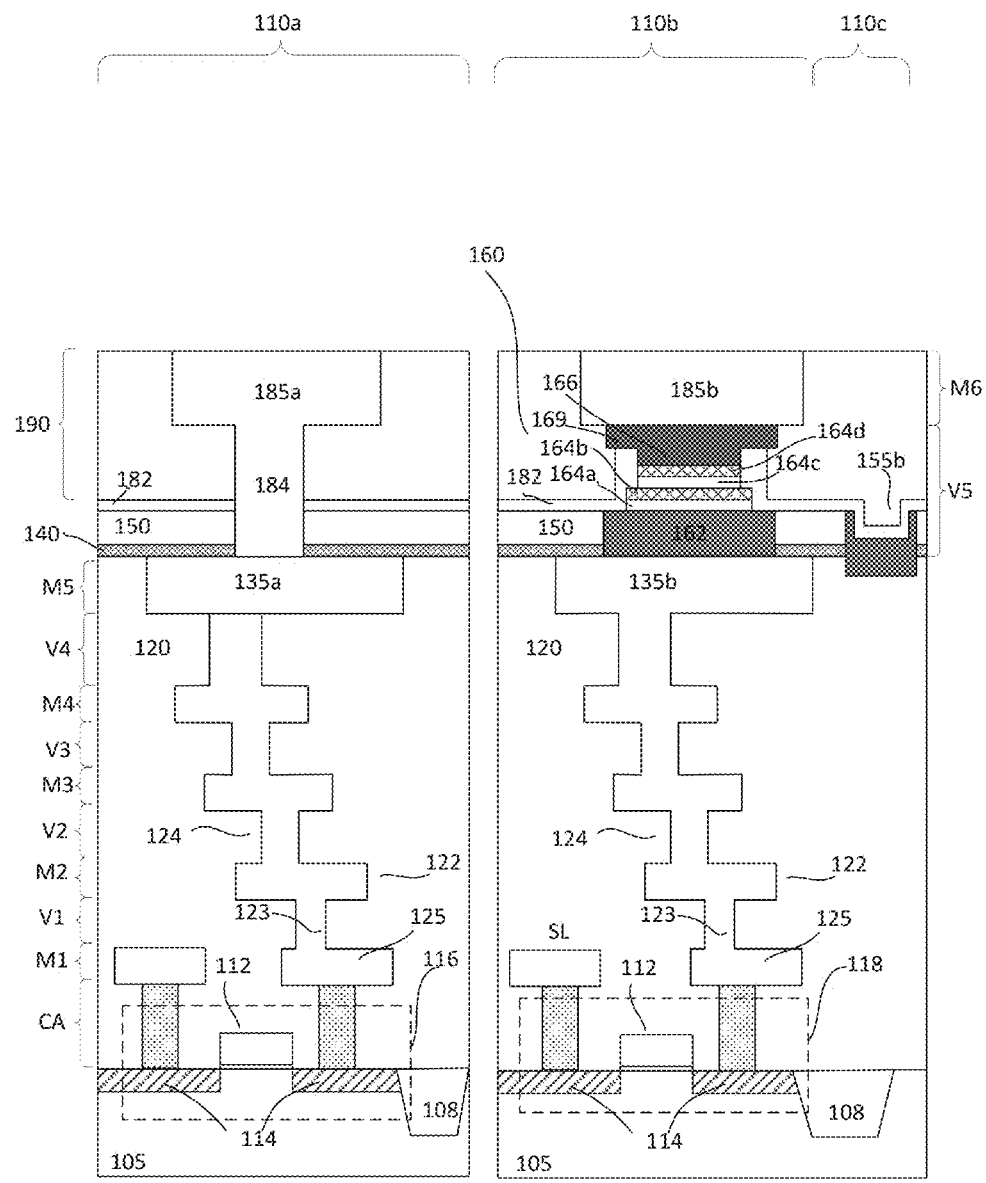
FIG. 4a shows cross-sectional views of logic and memory regions of an embodiment of a device and FIG. 4b shows enlarged cross-sectional views of logic and memory portions and scribe region of the device.
Figure 4B:
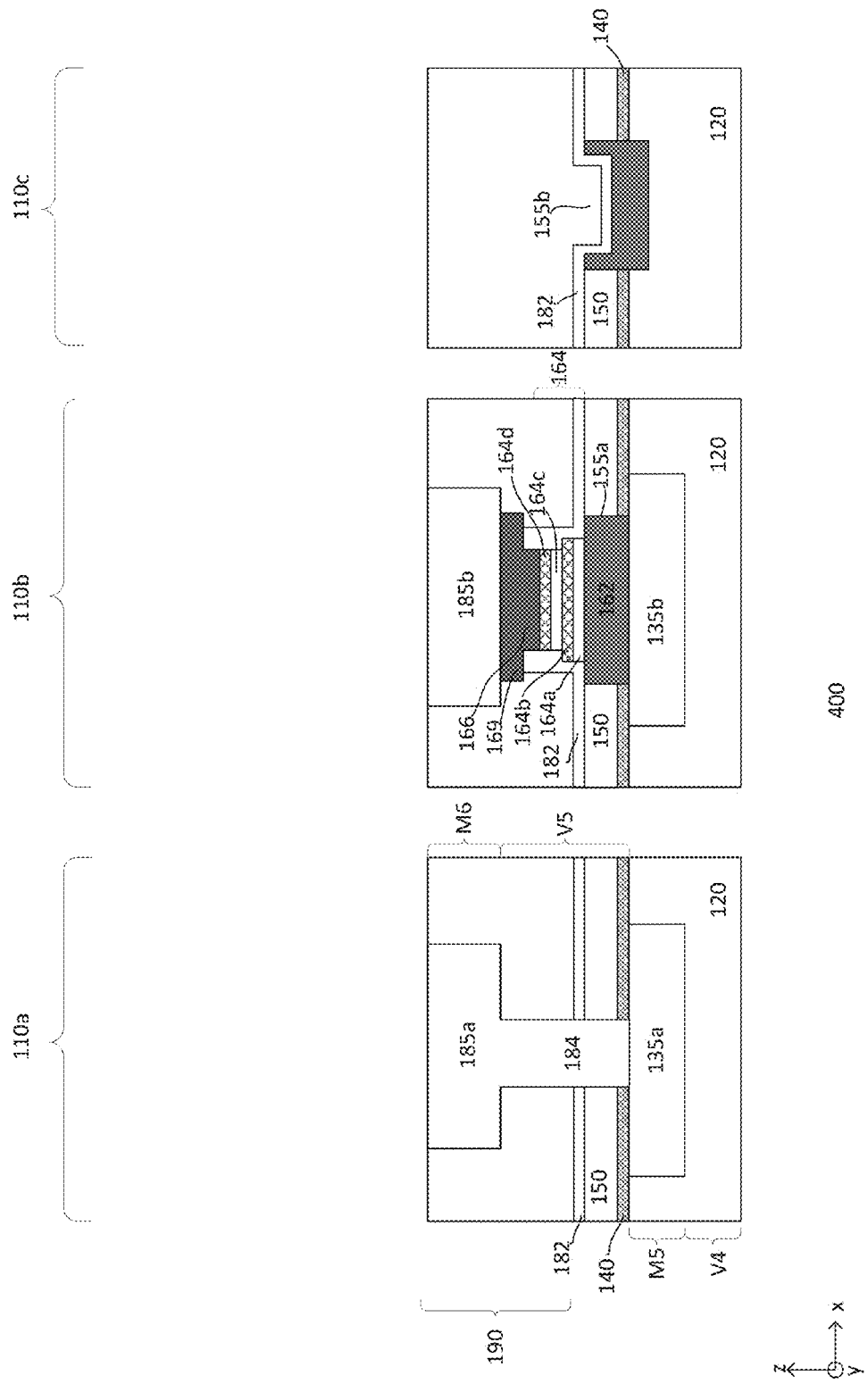

FIG. 4a shows cross-sectional views of first region 110a, second region 110b and third region 110c of an embodiment of a device 400. FIG. 4b shows enlarged cross-sectional views of upper ILD level of the first, second and third regions of the device 400. The first region 110a may be referred to as the logic region, the second region 110b may be referred to as the memory region and the third region 110c may be referred to as the scribe lane/region or dicing channel. The cross-sectional view, for example, is along a bitline (or x) direction of the device. The device 400, as shown, includes a memory cell having a cell selector unit or transistor and one or more logic transistors. The memory cell, for example, may be a NVM memory cell. The memory cell, in one embodiment, is a magnetoresistive NVM cell, such as a STT-MRAM cell.

The cell select unit of the memory cell and the logic transistor of the logic component are disposed on a substrate 105. For example, the logic transistor 116 is disposed in the first (or logic) region 110a and the memory cell selector unit 118 is disposed in the second (or memory) region 110b of the same substrate. The second region 110b is a memory cell region which may be part of an array region. For example, the array region may include a plurality of cell regions. The substrate may also include other types of device regions (not shown).

The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a bulk crystalline by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front end of line (FEOL) processing is performed on the substrate. The FEOL process, for example, forms n-type and p-type devices or transistors in the logic region 110a, the memory cell region 110b as well as other regions on the substrate. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

As shown, the FEOL processing forms at least a logic region 110a and a memory cell region 110b isolated by isolation regions 108, such as shallow trench isolation (STI) regions. The memory cell region is for a memory cell. Isolation regions may be provided to isolate columns of memory cells. Other configurations of isolation regions may also be useful. The first region 110a may include a logic device well (not shown) while the second region 110b may include a cell device well. The cell device well, for example, serves as a body well for a cell select transistor 118 of the memory cell while the logic device well, for example, serves as a body well for the logic transistor. The device wells may be doped with second polarity type dopants for first polarity type transistors. The device wells may be lightly or intermediately doped with second polarity type dopants. In some cases, a device isolation well (not shown) may be provided, encompassing the device well. The isolation well may have a dopant type which has the opposite polarity to that of the device well. For example, the isolation well may include first polarity type dopants. The isolation well serves to isolate the device well from the substrate. Well biases may be provided to bias the wells.

As shown, the first region includes a logic transistor 116 while the second region includes a cell selector unit 118. The cell selector unit includes a selector for selecting the memory cell. The selector, for example, may be a select transistor. In one embodiment, the select and logic transistors are metal oxide semiconductor (MOS) transistors. Thus, the FEOL processing forms the logic transistor in the first region and the cell selector transistor in the second region. The transistors, as shown, include first and second source/drain (S/D) regions 114 formed in the substrate and a gate 112 disposed on the substrate between the S/D regions. The S/D regions, for example, are heavily doped regions with first polarity type dopants, defining the first type transistor. For example, in the case of a n-type transistor, the S/D regions are n-type heavily doped regions. Other types of transistors or selectors may also be useful. As for the gate, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a wordline (or y) direction. The gate conductor forms a common gate for a row of cells.

A S/D region 114 may include LDD and halo regions (not shown). Dielectric spacers (not shown) may be provided on the gate sidewalls of the transistor to facilitate forming transistor halo, LDD and transistor S/D regions. It is understood that not all transistors include LDD and/or halo regions.

After forming the logic transistor in the first region and cell selector unit in the second region and other transistors (not shown) in other device regions, back end of line (BEOL) processing is performed. The BEOL process includes forming interconnects in interlevel dielectric (ILD) layers. The interconnects connect the various components of the IC to perform the desired functions. An ILD level includes a metal level 122 and a contact level 124. Generally, the metal level includes conductors or metal lines while the contact level includes via contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (ME) may also be employed to form metal lines.

A device may include a plurality of ILD layers or levels. For example, x number of ILD levels may be provided. As illustrated, the device includes 6 ILD levels (x=6). Other suitable number of ILD levels may also be useful. The number of ILD levels may depend on, for example, design requirements or the logic process involved. A metal level of an ILD level may be referred to as NI, where i is from 1 to x and is the $i^{th}$ ILD level of x ILD levels. A contact level of an ILD level may be referred to as where i is the $i^{th}$ ILD level of x ILD levels.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric layer or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as ME, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as chemical mechanical polishing (CMP), is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The first ILD layer, for example, is formed of a low-k dielectric material, where k is about 2.7 or less. Preferably, the first ILD layer is an ultra low-k dielectric layer, such as SiCOH, where k is about 2.1. Other suitable types of low-k dielectric materials may also be useful. The dielectric layer may be formed by CVD. Other suitable techniques for forming the first ILD layer may also be useful.

Conductive lines 125 are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving planar surface with the conductive line and M1 level dielectric layer. The first metal level M1 and CA may be referred as a lower ILD level.

The process continues to form additional or upper ILD layers/levels. The additional ILD levels may include ILD level 2 to ILD level x. For example, in the case where x=6 (6 levels), the upper ILD level includes ILD levels from 2 to 6, which includes M2 to M6. Designating other ILD levels as upper ILD level may also be useful. The number of ILD levels may depend on, for example, design requirements or the logic process involved. The ILD layers, in one embodiment, are formed of low-k dielectric materials, where k is about 2.7 or less. Preferably, the ILD layers of ILD levels 2 to 5 include ultra low-k dielectric layers, such as SiCOH, where k is about 2.1 while the ILD layer of ILD level 6 includes a low-k dielectric layer, such as SiCOH, where k is about 2.7. Other suitable types of low-k dielectric materials may also be useful. The ILD layers may be formed by, for example, CVD. Other techniques for forming the ILD layers may also be useful.

The conductors and contacts of the additional ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed by, for example, CMP, forming conductors and contacts in an ILD layer.

A dielectric liner (not shown) may be disposed between ILD levels and on the substrate. The dielectric liner, for example, serves as an etch stop layer. The dielectric liner may be formed of a low k dielectric material. For example, the dielectric liner may be nBLOK. Other types of dielectric materials for the dielectric liner may also be useful.

The uppermost ILD level (e.g., M6) may have different design rules, such as critical dimension (CD), than the lower ILD levels. For example, Mx may have a larger CD than metal levels M1 to Mx−1 below. For example, the uppermost metal level may have a CD which is 2× the CD of the metal levels below.

As shown, S/D contacts are disposed in the CA level. The S/D contacts are coupled to the first and second S/D regions of the transistors in the first and second regions. Other S/D contacts coupled to other S/D regions of transistors may also be provided. The CA level may include a gate contact (not shown) coupled to the gate of the transistor. The gate contact may be disposed in another cross-section of the device. The gate contact is coupled to a wordline (WL) which may be provided by the gate or provided in any suitable metal level. The contacts may be tungsten contacts. Other types of contacts may also be useful. Other S/D and gate contacts for other transistors may also be provided.

As described, metal lines are provided in M1. The metal lines are coupled to the S/D contacts. As an example, a source line (SL) is coupled to the second S/D region of the select transistor. As for the first S/D contact, it may be coupled to a contact pad or island in M1. The contact pad provides connections to upper ILD levels. The metal lines or pads may be formed of copper or copper alloy. Other types of conductive material may also be useful.

As for the additional or upper ILD levels, for example, from 2 to 6, they include contacts 123 in the via level 124 and contact pads/metal lines 125 in the metal level 122. The contacts and contact pads provide connection from M6 to the first S/D region of the transistors in the first and second regions.

As shown in FIG. 4a, the first region 110a accommodates a logic component and the second region 110b accommodates a MRAM cell. The MRAM cell includes a storage or memory element which is generally disposed in between adjacent final metal levels of upper ILD level in the second region 110b of the device. In one example, the storage element is formed in between adjacent upper ILD levels, such as upper ILD level 5 to 6. It is understood that the storage element of the MRAM cell may be disposed in between any suitable adjacent ILD levels. For illustration purpose, the enlarged cross-sectional views of the logic and memory portions of the device shown in FIG. 1b show a dielectric layer 120 which corresponds to upper ILD level 5. The upper ILD level 5, for example, includes a via level and a metal level. The upper ILD level 5, for example, includes via level V4 and metal level M5. One or more via contacts (not shown) may be disposed in V4 in the first and second regions 110a-110b.

For the sake of simplicity, the dielectric layer 120 in this disclosure may be referred to as a first upper dielectric layer and its via and metal levels may be referred to as a first upper interconnect level. As shown in the first and second regions, metal lines 135a-135b are disposed in the metal level (e.g., M5) of the first upper dielectric layer 120. The metal line 135a, for example, may be referred to as a lower interconnect of the upper ILD levels in the first region. The metal line 135a may be coupled to first S/D region of the logic transistor 116 disposed on the substrate. The metal line 135b, for example, is coupled to a MTJ element of the MRAM cell which will be described later. The metal line 135b, for example, may be used for connection purpose and couples the MTJ element to first S/D region of the select transistor 118. Although one metal line is shown in each of the first and second regions, it is understood that there could be other suitable number of metal lines in the same metal level of the first and second regions.

The metal lines 135a-135b include a conductive material. The conductive material, for example, includes copper (Cu). Other suitable types of conductive material may also be useful. The dimensions of this metal line 135a and its underlying via contact (not shown), for example, are defined at the minimum line resolution of the lithography and etch capability for a technology process node, which may be referred to as 1× design rule. The thickness of the metal lines 135a-135b with reference to the top surface of the first upper dielectric layer 120, for example, is about 850-1000 Å. Other suitable thickness dimensions may also be useful, depending on the design requirements of a technology node.

A dielectric liner 140 is disposed above the first upper dielectric layer 120 in the first, second and third regions 110a-110c and covering the metal lines 135a-135b in the first and second regions. The dielectric liner, for example, serves as an etch stop layer. The dielectric liner may be a low k dielectric liner. For example, the dielectric liner may be nBLOK. Other suitable types of dielectric materials for the dielectric liner may also be useful.

A second upper dielectric layer 150 is disposed on the first upper dielectric layer 120. For example, the second upper dielectric layer is disposed on the dielectric liner 140. The second upper dielectric layer, in one embodiment, includes a low-k dielectric material, where k is equal to about 2.7 or less. For example, the low-k dielectric material includes a low-k dielectric layer, such as SiCOH, where k is about 2.7. Other suitable dielectric materials and thicknesses for the second upper dielectric layer may also be useful.

The second upper dielectric layer 150, in one embodiment, includes trenches 155a and 155b in the second and third regions 110b-110c. The trench 155a in the second region, for example, accommodates a bottom electrode of a storage element of the MRAM cell as will be described later while the trench 155b is an alignment trench that is disposed in the scribe region or scribed lane 110c adjacent to the memory region. The trench 155a, for example, extends from the top surface of the second upper dielectric layer to the top surface of the metal line 135b while the alignment trench 155b extends from the top surface of the second upper dielectric layer 150 and extends partially into the first upper dielectric layer 120. During processing, the alignment trench 155b, for example, provides topographic feature which is used to align subsequently deposited memory or magnetic stack layers and subsequent formed layers of the storage element of the MRAM cell. The topographic feature is also used as an alignment mark for patterning the magnetic stack layers such that the patterned layers are aligned and coupled to the underlying bottom electrode which will be described in FIGS. 6a-6m later.

In the second region 110b, a storage element 160 of the MRAM cell is disposed over the second upper dielectric layer. In one embodiment, the MRAM cell is a STT-MRAM cell and the storage element includes a magnetic tunnel junction (MTJ) element. Other suitable types of storage elements or memory cells may also be useful.

The storage element includes first and second electrodes. The first electrode, for example, may be a bottom electrode 162 while the second electrode may be a top electrode. In one embodiment, the top electrode includes a lower top electrode portion 166 and an upper top electrode portion 169. Other configurations of electrodes may also be useful. The bottom electrode 162 of the memory element is disposed in the trench 155a and is connected to the metal line 135b. The bottom electrode 162, in one embodiment, extends through the second upper dielectric layer and dielectric liner and is directly coupled to the metal line 135b in the second region. As for the third region 110c, the alignment trench 155b is partially filled with a bottom electrode material which includes a topographic feature to serve as an alignment mark for patterning the MTJ stack of the storage element later.

The storage element includes a MTJ stack 164 disposed in between the top and bottom electrodes. The storage element, for example, may include a bottom-pinned MTJ element or a top-pinned MTJ element. The bottom-pinned MTJ element is formed by having the magnetically fixed layer disposed below the magnetically free layer while the top pinned MTJ element is formed by having the fixed layer disposed above the free layer. For illustration purpose, the MTJ stack includes four layers. It is understood that the MTJ stack may include other suitable number of layers. The MTJ stack generally includes a magnetically fixed (pinned) layer 164a, one or more tunneling barrier layers 164b and 164d and a magnetically free layer 164c. The fixed layer includes a magnetic layer and a pinning layer. The pinning layer, for example, pins the magnetization direction of the magnetic layer, forming a pinned layer.

By way of example, the free layer and the fixed layer may be CoFeB or CoFe based composite material and the tunneling barrier layer may be MgO or $Al_2O_3$. As for the pinning layer, it may be PtMn or IrMn. The top and bottom electrodes may be Ti, TiN, Ta, TaN or other suitable metals used in the semiconductor process. Other suitable configurations or materials of storage or memory element may also be useful.

The lower top electrode portion 166 and upper layers 164c-164d of the MTJ stack of the memory cell, for example, have sidewalls that are aligned with each other and include a length dimension which is smaller than a length dimension of the lower layers 164a-164b of the MTJ stack and bottom electrode 162. The fixed layer 164a and the tunnel barrier 164b of the MTJ stack in the second region as defined includes a length which is greater than the length of the free layer 164c and tunnel barrier 164d of the MTJ stack 164 and the lower top electrode portion 166 in the x direction such that it is easy for process control and to prevent electrical shorts between the lower top electrode portion and the bottom electrode as well as to prevent electrical shorts between the free and fixed layers of the MTJ stack.

In one embodiment, an encapsulation liner 182 may line exposed top surface of the second upper dielectric layer 150 in the first, second and third regions. The encapsulation liner, as shown, also lines exposed surfaces of the bottom electrode 162, side surfaces of the MTJ stack 164 and side surfaces of the lower top electrode portion 166 in the second region, as shown in FIG. 4b. The encapsulation liner may be a low k dielectric liner. For example, the dielectric liner may be nBLOK. Other suitable types of dielectric materials for the encapsulation liner may also be useful.

A dielectric layer 190 is disposed over the second upper dielectric layer 150. The dielectric layer 190, for example, covers the storage element in the second region and the alignment trench 155b in the third region. The dielectric layer 190 and the second upper dielectric layer 150, for example, corresponds to upper ILD level 6. The dielectric layer, for example, is a dielectric stack having one or more dielectric layers. For instance, the dielectric layer 190 may include third, fourth and fifth or other suitable number of upper dielectric layers. The dielectric layer 190 includes low-k dielectric material, where k is about 2.7 or less. Preferably, the third, fourth and fifth or other suitable number of upper dielectric layers include low-k dielectric layers, such as SiCOH, where k is about 2.7. Other suitable configurations and materials for the dielectric layer may also be useful.

The dielectric layer 190 includes a dual damascene interconnect structure in the first region and a damascene interconnect structure in the second region. For example, the dielectric layer 190 includes a via contact 184 which couples a metal line 185a or upper interconnect to the lower interconnect 135a in the logic region 110a while the dielectric layer 190 accommodates the storage element and includes a metal line 185b coupled to the storage element of the memory cell in the memory region 110b. The metal lines 185a-185b are disposed in the metal level while the via contact is disposed in the via level of the dielectric layer 190. For simplicity, the via and metal levels of the dielectric layer 190 may be referred to as a second upper interconnect level. For example, the metal lines 185a-185b may be disposed in metal level M6 while the via contact 184 and the storage element may be disposed in via level V5. The metal line 185b, for example, may serve as a bitline (BL). Providing the bitline at other metal level may also be useful. Although one metal line is shown for each first and second regions in metal level M6, it is understood that there could be other suitable number of metal lines in the same metal level of the first and second regions.

The via contact 184, for example, may be referred to as the top via contact and the metal lines 185a-185b, for example, may be referred to as the top metal line. The dimensions of the metal lines 185a-185b and the via contact 184, for example, are defined at twice the minimum line resolution of the lithography and etch capability for a technology process node, which may be referred to as 2× design rule. For example, the thickness of the top metal lines 185a-185b, for example, may be at least 2 times greater than the thickness of the metal lines 135a-135b below. The top via contact 184, as shown in FIG. 4b, couples the metal line 185a in upper metal level to the metal line 135a in lower metal level. The top via contact 184, for example, extends through the second upper dielectric layer 150 and dielectric liner 140. The top metal lines 185a-185b include a thickness of, for example, about 2150 Å while the top via contact 184, for example, includes a height or thickness of about 1800 Å along the z direction based on 28 nm technology node as shown in FIG. 4b. Other suitable thickness dimensions may also be useful, depending on the design requirements of a technology node. The top via contact and top metal line include a conductive material, such as Cu. Other suitable configurations and conductive materials for the via contact and metal lines may also be useful.

A pad level (not shown) is disposed over the uppermost ILD level. For example, a pad dielectric level is disposed over Mx. In the case where the device includes 6 metal levels, the pad level is disposed over M6. The pad dielectric layer, for example, may be silicon oxide. Other types of dielectric materials may also be useful. The pad dielectric layer includes pads, such as bond pads or pad interconnects for providing external interconnections to the components. Bond pads may be used for wire bonding while pad interconnects may be provided for contact bumps. The external interconnections may be input/output (I/O), power and ground connections to the device. The pads, for example, may be aluminum pads. Other types of conductive pads may also be useful. A passivation layer, such as silicon oxide, silicon nitride or a combination thereof, may be provided over the pad level. The passivation layer includes openings to expose the pads.

Figure 5A:
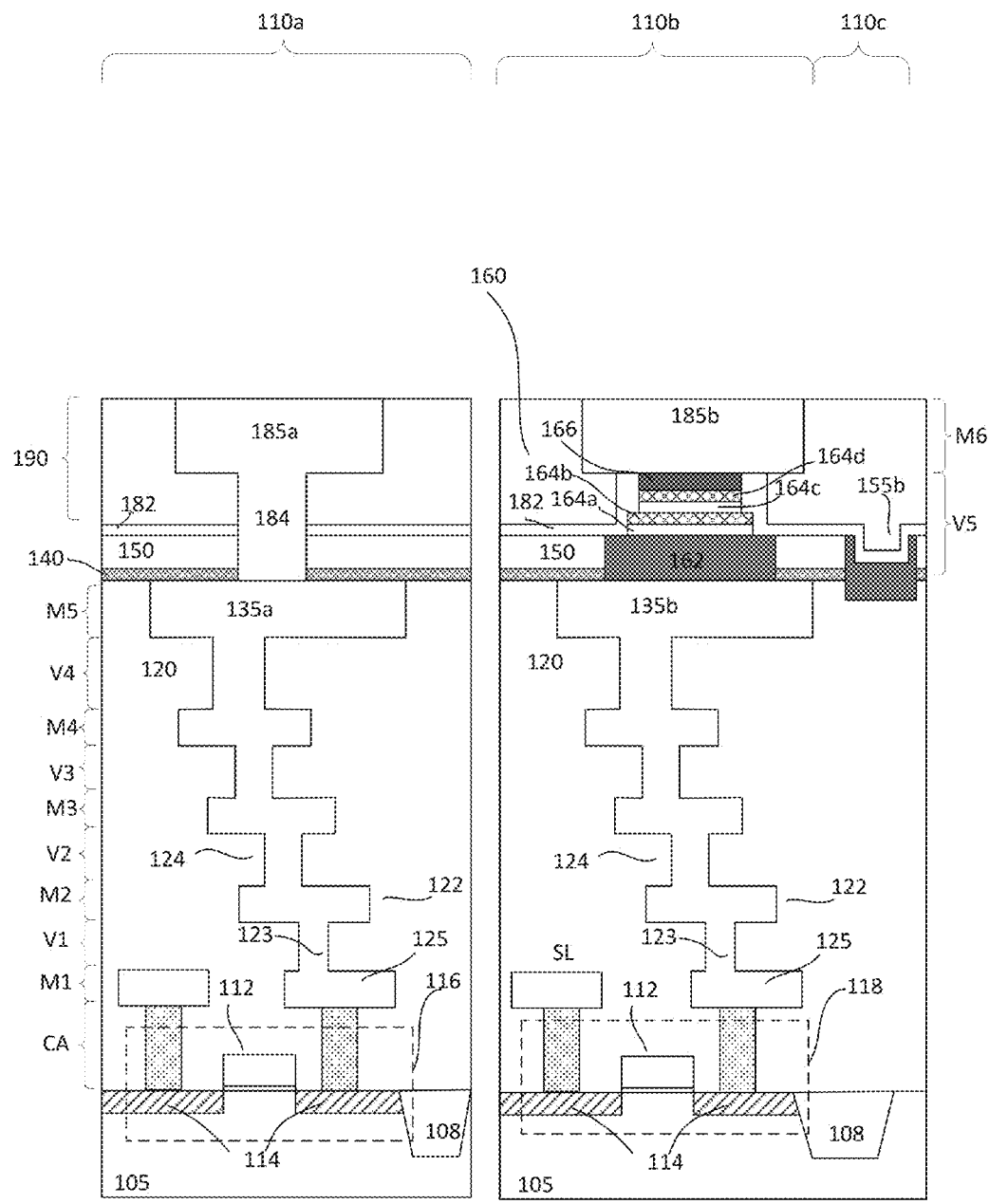
FIG. 5a shows cross-sectional views of logic and memory regions of another embodiment of a device and FIG. 5b shows enlarged cross-sectional views of logic and memory portions and scribe region of the device.
Figure 5B:
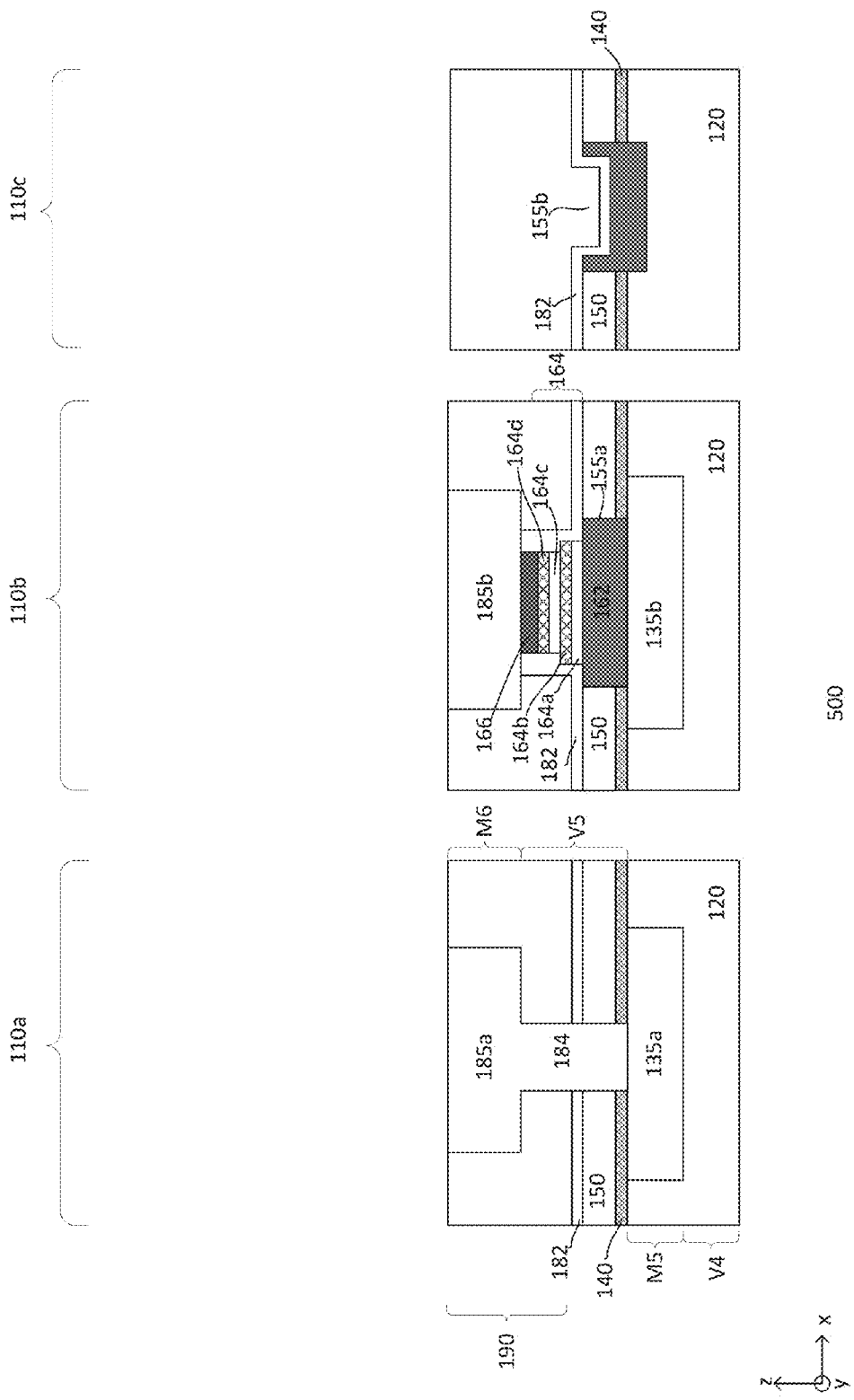

FIG. 5a shows cross-sectional views of first (or logic) region 110a, second (or memory) region 110b and third (or scribe) region 110c of another embodiment of a device 500. FIG. 5b shows enlarged cross-sectional views of upper ILD level of the first, second and third regions of the device 500. The device 500, for example, is similar to the device 400 as described in FIGS. 4a-4b. Common elements and features having the same reference numerals may not be described or described in detail. In the interest of brevity, the description of the device 500 below primarily focuses on the difference(s) compared with the device 400 shown in FIGS. 4a-4b.

As shown in FIGS. 5a-5b, the device 500 includes a storage element having first and second electrodes. The first electrode, for example, may be the bottom electrode 162 while the second electrode may be a top electrode. In one embodiment, the device 500 differs from the device 400 in that the top electrode includes a single top electrode portion 166 which has side surfaces aligned with upper layers 164c-164d of the MTJ stack. As shown, the top metal line 185b is directly coupled to the top electrode 166 having a top surface which is coplanar with the top surface of the encapsulation liner 182. The dielectric layer 190, for example, is a dielectric stack having one or more dielectric layers. The dielectric layer 190, as shown in FIGS. 5a-5b, may include lesser number of upper dielectric layers relative to the dielectric layer 190 shown in FIGS. 4a-4b. For instance, the dielectric layer 190 includes third and fourth or other suitable number of upper dielectric layers as will be described in FIGS. 8a-8b later.

FIGS. 6a-6m show simplified cross-sectional views of a process 600 for forming an embodiment of a device. The cross-sectional views of the process 600 are taken along first (or logic) region 110a, second (or memory) region 110b and third (or scribe) region 110c of the device. In one embodiment, the process allows a memory cell to be formed with logic components on the same substrate using logic processing. The process 600 which forms the memory cell together with the logic components are generally based on any suitable technology node (including but not limited to 28 nm technology node) where low-k dielectric layers are used in back-end-of-line (BEOL) processing. The memory cell, for example, may be a MRAM cell. The MRAM, in one embodiment, is a STT-MRAM cell. The device formed, for example, is similar or the same as that shown and described in FIGS. 4a-4b. As such, common elements may not be described or described in detail.

For simplicity, the processing of a substrate to form transistors using FEOL and processing of lower ILD level and lower levels of an upper ILD level using BEOL are not shown. Referring to FIG. 6a, the process 600 is at the stage of providing a dielectric layer 120 over a substrate (not shown). The dielectric layer 120, for example, may correspond to upper ILD level 5 having via level V4 and metal level M5. For the sake of simplicity and for illustration purpose, the dielectric layer 120 may be referred to as a first upper dielectric layer and its via and metal levels may be referred to as a first upper interconnect level. The dielectric layer 120 is formed of a low-k dielectric material, where k is about 2.7 or less. Preferably, the dielectric layer 120 includes an ultra low-k dielectric layer, such as SiCOH, where k is about 2.1. Other suitable low-k dielectric materials may also be useful.

The process includes forming suitable via openings (not shown) and trenches in the first (or logic) region 110a and second (or memory) region 110b. First type trenches 635 are formed in the first upper dielectric layer 120 of the first and second regions 110a and 110b. A photoresist (not shown) is applied to the top surface of the first upper dielectric layer to define a pattern arrangement for fabricating the trenches. Portions of the first upper dielectric layer not protected by the photoresist are removed (e.g., by using an etching process) to form the trenches. The etching process, for example, may be an anisotropic etch, such as RIE. Other suitable removal process may also be employed.

In one embodiment, the trenches 635 in the first and second regions are formed simultaneously. The trenches, for example, include the same depth dimension defined by, for example, 1× design rule. The depth of the trenches, for example, is about 850-1000 Å with reference to the top surface of the first upper dielectric layer based on 28 nm technology node. Other suitable depth dimensions may also be useful, depending on design requirement of a technology node.

The process continues by depositing a conductive layer on top of the first upper dielectric layer and fills the trenches. The conductive layer, for example, may be formed by chemical vapor deposition (CVD). The conductive layer, for example, includes Cu. Other suitable conductive materials and deposition techniques may also be employed. A chemical mechanical polishing (CMP) process is performed to remove excess conductive material on top of the first upper dielectric layer and to provide a substantially planar surface. The trenches filled with conductive material form a metal line 135a in the first region and a metal line 135b in the second region. Although one metal line is shown in the first and second regions, it is understood that there could be more than one metal line being formed in the same metal level of the first and second regions. The metal line 135a may correspond to an interconnect in a metal level in the first region 110a while the metal line 135b may be coupled to a MTJ element which will be formed in the second region. As shown, the process forms metal lines 135a and 135b simultaneously in a metal level (e.g., M5) of the device.

Referring to FIG. 6a, a dielectric liner 140 is formed above the first upper dielectric layer covering the metal lines 135a and 135b in the first and second regions. The dielectric liner, for example, serves as an etch stop layer. The dielectric liner may be a low k dielectric liner. For example, the dielectric liner may be nBLOK. Other suitable types of dielectric materials for the dielectric liner may also be useful. The dielectric liner, for example, is formed by CVD. Other suitable techniques for forming the dielectric liner may also be useful.

The process continues to form a second upper dielectric layer 150. As shown in FIG. 6a, a second upper dielectric layer 150 is formed on the first upper dielectric layer. For example, the second upper dielectric layer is formed on the dielectric liner 140. The second upper dielectric layer, in one embodiment, includes a low-k dielectric material, where k is less than or equal to about 2.7. Preferably, the second upper dielectric layer 150 is formed of a low-k dielectric layer, such as SiCOH, where k is about 2.7. The second upper dielectric layer may be formed by CVD. Any other suitable forming techniques or suitable low-k materials and thicknesses for the second upper dielectric layer may also be useful.

In FIG. 6b, the second upper dielectric layer 150 and the dielectric liner 140 in the second (or memory) region 110b and third (or scribe) region 110c are patterned to form trench openings 155a-155b. In one embodiment, the opening 155a in the second region includes sufficient depth to accommodate a bottom electrode which will be coupled to the MTJ element of the memory cell while the opening 155b in the third region includes sufficient depth to serve as an alignment trench which provides adequate topography which is used for aligning and defining subsequently formed layers of the MTJ element. The alignment trench 155b, in one embodiment, is formed simultaneously with the opening 155a which accommodates the bottom electrode. Although a single opening is shown corresponding to an alignment trench in the third region, the alignment trench may include a plurality of groups and subgroup of alignment trenches.

The trenches may be rectangular or square shape or may include other suitable shapes. The trenches may be formed by mask and etch techniques. For example, a patterned photoresist mask may be formed over the second upper dielectric layer, serving as an etch mask. An etch, such as RIE, may be performed to pattern the second upper dielectric layer and dielectric liner using the patterned resist etch mask. In one embodiment, the etch transfers the pattern of the mask to the second upper dielectric layer, including the dielectric liner to form the trenches 155a-155b. As shown, the etch stops when it reaches a top surface of the metal line 135b in the second region while the etch forms the alignment trench 155b which has a depth slightly deeper than the trench opening 155a. The metal line 135b, for example, serves as an etch stop for the trench opening 155a.

The process continues by depositing a conductive layer 662 over the first, second and third regions as shown in FIG. 6c. For example, the conductive layer 662 is conformally formed over a top surface of the second upper dielectric layer in the first, second and third regions and fills the trench openings in the second and third regions. The conductive layer, for example, may include Ti, TiN, Ta or TaN and may be formed by physical vapor deposition (PVD). Other suitable conductive materials and deposition techniques may also be employed. A CMP process is performed to remove excess conductive material on top of the second upper dielectric layer and to provide a substantially planar top surface. As shown in FIG. 6d, the CMP process removes the conductive layer over the first region and defines the bottom electrode 162 in the second region while a portion of the conductive layer 662 remains in the alignment trench 155b. As shown in FIG. 6d, the profile of the alignment trench is transferred to the surface of the portion of the conductive layer 662, creating adequate topography feature 155b in the third region which is visible from the top surface of the substrate. The topography feature may be used as an alignment mark during patterning to define upper layers of MTJ stack of the MRAM cell later. The presence of such topography feature in the third region avoids the use of an additional alignment mask.

Figure 6E:
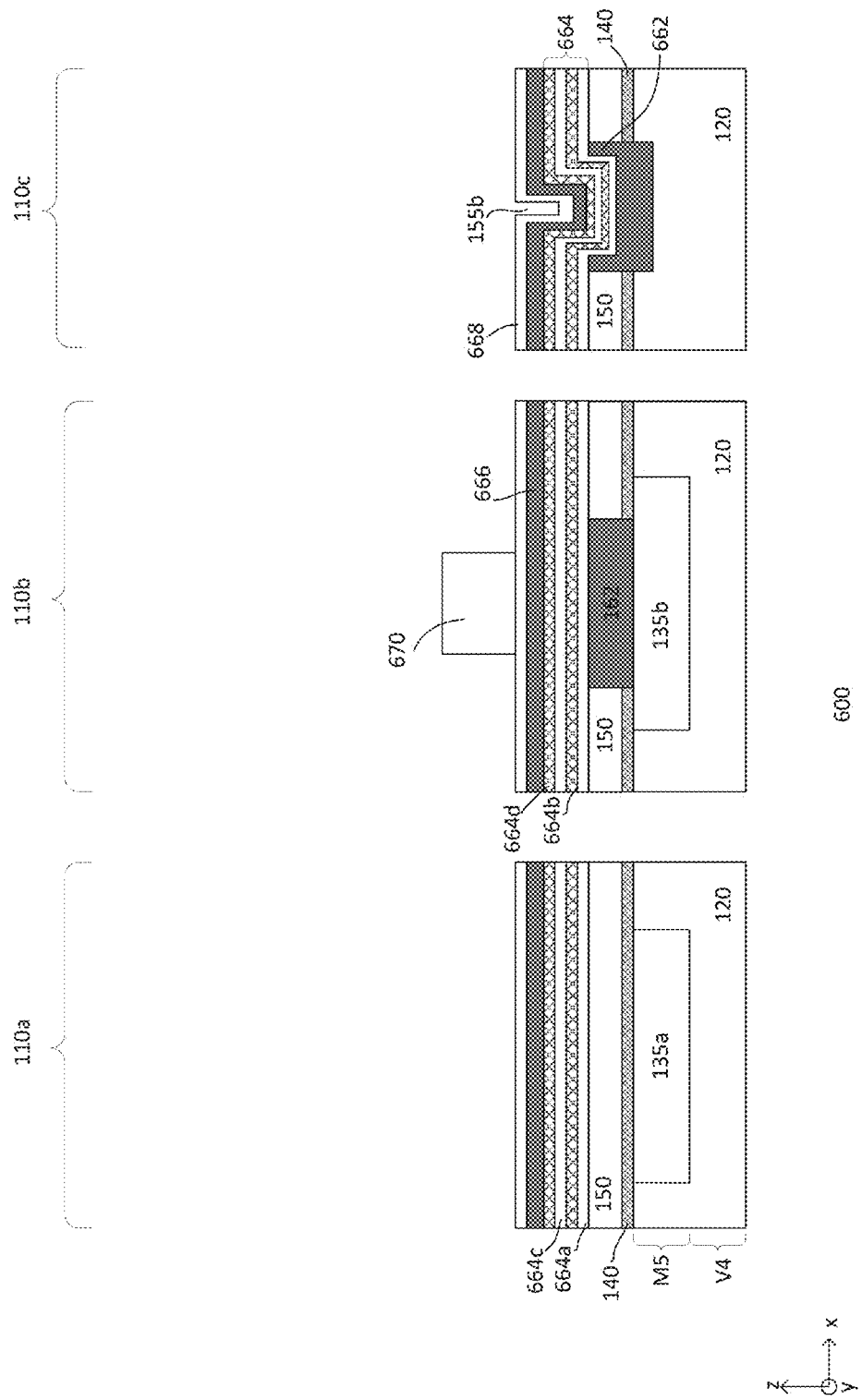

The process continues to form MTJ stack of the MRAM cell. Various layers of the MTJ stack are formed on the second upper dielectric layer 150 as shown in FIG. 6e. For example, various layers of the MTJ stack of the MRAM cell are sequentially formed over the second upper dielectric layer in the first, second and third regions. The process forms various layers of the MTJ stack 664, a top electrode layer 666 and a hard mask layer 668 over the second upper dielectric layer 150 by PVD process. As shown in FIG. 6e, the various layers of the MTJ stack are conformally formed and follow the profile of the underlying bottom electrode layer 662 in the alignment trench. Other suitable techniques may also be used. The MTJ stack, for example, is shown to include four layers 664a-664d having materials the same as that described in FIGS. 4a-4b. It is understood that the MTJ stack may include other suitable number of layers and other suitable materials. The top electrode layer 666, for example, may include the same material as the bottom electrode while the hard mask layer 668, for example, includes an oxide material.

The process continues to pattern the top electrode layer 666 and upper layers 664c-664d of the MTJ stack as shown in FIG. 6e. Patterning the layers may be achieved with mask and etch techniques. A soft mask 670, such as a photoresist layer, is formed on the hard mask layer. The soft mask is patterned to form a pattern which is used to define the top electrode and upper MTJ layers. To form the pattern in the mask layer, it may be selectively exposed with an exposure source using a reticle (not shown) such as that shown in FIG. 3. In one embodiment, the reticle (not shown) used to expose the resist mask is aligned using the alignment mark 155b, which is visible as topography even after the deposition of the top electrode and hard mask layers. The pattern of the reticle is transferred to the resist layer 670 after exposure by a development process.

As shown in FIG. 6e, the patterned mask 670 is used define the tunnel barrier 164d and free layer 164c of the MTJ stack and top electrode 166 of the memory cell and hard mask 168 by removing portions of the upper layers of the MTJ stack, top electrode layer and hard mask layer not protected by the patterned mask in the first, second and third regions. As shown, the top electrode and upper layers of the MTJ stack are patterned in such a way that the top electrode and the upper layers of the MTJ stack are aligned and properly coupled to the bottom electrode in the second region using the topography which is present in the alignment trench 155b. Other suitable techniques for patterning the layers and to ensure that the top electrode and MTJ stack align and properly couple to the underlying bottom electrode 162 in the second region may also be useful.

As shown in FIG. 6f, the top electrode layer 666, the tunnel barrier 664d and free layer 664c of the MTJ stack are completely removed from the first and third regions. Other suitable techniques for patterning the upper layers of the MTJ stack and top electrode layer may also be useful. As shown, the fixed layer and the tunnel barrier layer 664a-664b remain unetched in the first, second and third regions. The patterned mask is removed using suitable techniques, such as ashing.

The process continues by depositing a dielectric liner 680 over the first, second and third regions as shown in FIG. 6g. The dielectric liner 680 covers exposed surfaces of the top electrode and patterned MTJ layers in the second region while covering top surface of the tunneling barrier 664b in the first and third regions. The dielectric liner 680, for example, may be formed by CVD and serves as an etch stop layer or protective layer during subsequent processing. The dielectric liner may be a low k dielectric liner. For example, the dielectric liner may be nBLOK. Other suitable types of dielectric materials for the dielectric liner and forming techniques may also be useful.

Figure 6H:
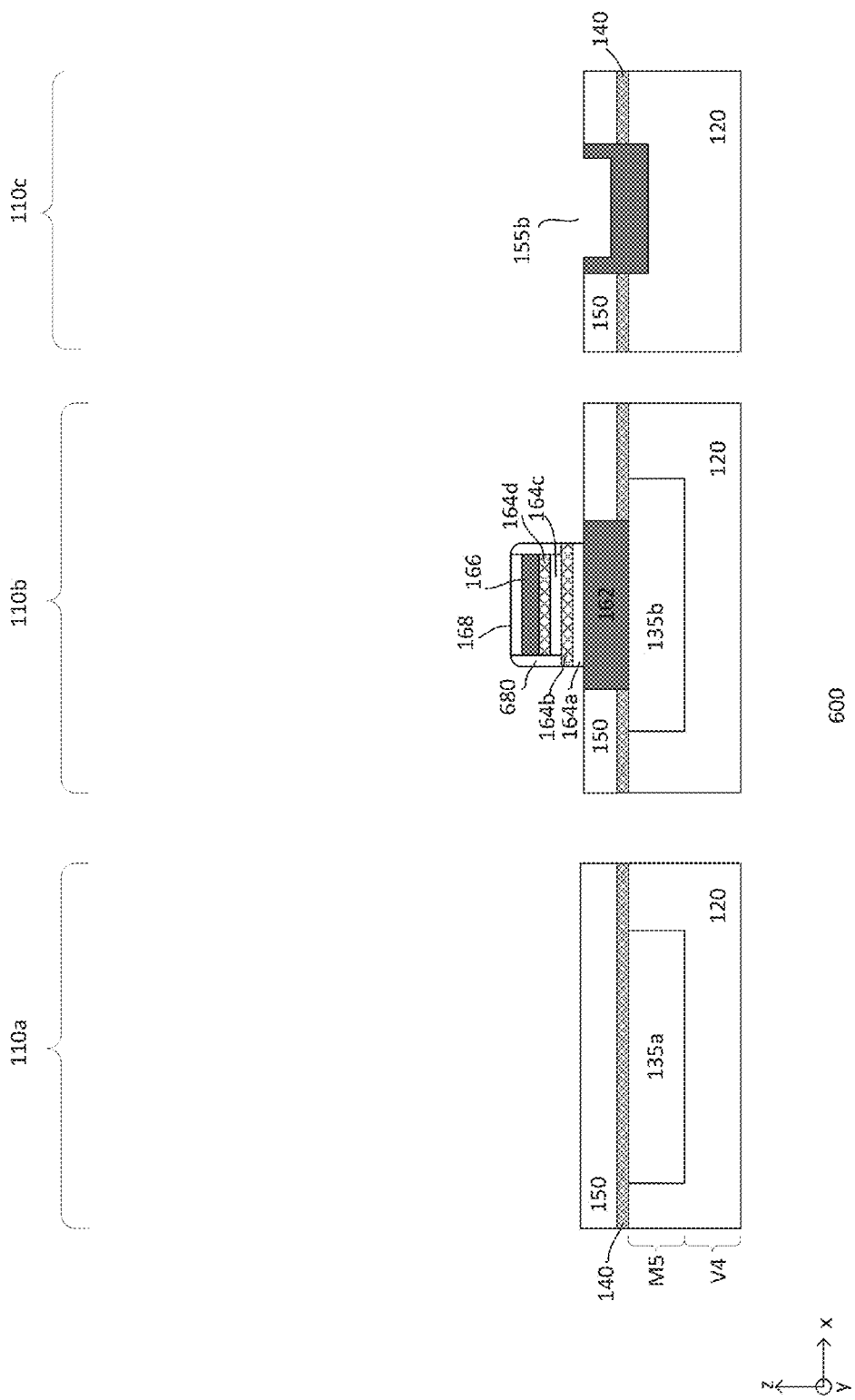

Referring to FIG. 6h, the process continues to process the dielectric liner 680. For example, the dielectric liner 680 is patterned to remove horizontal portions, leaving vertical portions or spacers lining sidewalls of the patterned upper MTJ layers 164c-164d, top electrode 166 and hard mask 168. Removal can be achieved, for example, using a blanket dry etch, such as RIE. Other suitable techniques may also be useful. The process continues to define lower layers 664a-664b of the MTJ stack. In one embodiment, the etch to define the lower layers of the MTJ stack is highly selective to materials of the lower MTJ stack layers. As shown, the etch process defines the tunnel barrier 164b and the fixed layer 164a of the MTJ stack in the second region while the lower layers of the MTJ stack in the first and third regions are completely removed. The etch stops when it reaches the top surface of the second upper dielectric layer 150. As shown in FIG. 6h, the fixed layer 164a and the tunnel barrier 164b of the MTJ stack are defined without using an additional mask as the dielectric spacers 680 serve as the etch mask and protects the upper layers of the MTJ stack during the etch process. The fixed layer 164a and the tunnel barrier 164b of the MTJ stack in the second region as defined includes a length which is greater than the length of the free layer 164c and tunnel barrier 164d of the MTJ stack 164 and top electrode 166 in the x direction such that it is easy for process control and to prevent electrical shorts between the top and bottom electrodes as well as to prevent electrical shorts between the free and fixed layers of the MTJ stack.

The process continues to form an encapsulation liner 182 over the first, second and third regions as shown in FIG. 6i. The encapsulation liner 182, for example, includes the same material and is formed using the same technique as that described for the dielectric liner 680. As shown, the encapsulation liner covers exposed surfaces of the second upper dielectric layer 150, bottom electrode and the MTJ stack 164 including the dielectric spacers 680 disposed on sidewalls of the upper layers of the MTJ stack.

A third upper dielectric layer 690 is formed. The third upper dielectric layer is formed over the encapsulation liner 182 in the first, second and third regions as shown in FIG. 6j. The third upper dielectric layer, for example, includes a low-k dielectric material which is the same material as the second upper dielectric layer. The third upper dielectric layer may be formed by CVD and includes a thickness sufficient to cover the patterned MTJ stack 164 and top electrode 166 in the second region. Other suitable dielectric materials and techniques may be used for forming the third upper dielectric layer. A planarization process is performed to remove excess third upper dielectric layer 690. The planarization process, for example, may be achieved by CMP. Other suitable techniques may also be useful. The planarization process produces a substantially planar top surface. As shown, the planarization process removes a top portion of the encapsulation liner 182 and hard mask 168 until a top surface of the top electrode 166 is exposed in the second region as shown in FIG. 6j. The planarized third upper dielectric layer 690, for example, surrounds and covers the sides of the MTJ stack in the second region.

As shown, the top electrode 166 and the MTJ stack are formed in a via level (e.g., V5) of an ILD level. The top electrode 166 and the MTJ stack 164 may not be sufficiently thick to match the height of a via contact to be formed in the first (or logic) region. In such case, the process 600, in one embodiment, continues to form an additional top electrode layer over the first, second and third regions. In one embodiment, the additional top electrode layer includes the same material as the top electrode 166 and is formed using the same technique as described with respect to the top electrode 166. The additional top electrode layer, for example, includes a sufficient thickness such that the total thickness of the additional top electrode 169, top electrode 166, MTJ stack 164 and the bottom electrode 162 in the second (or memory region) matches the desired height of the via contact to be formed in the first (or logic region) in the same via level. After the additional top electrode layer is formed, a patterned photoresist mask (not shown) may be formed over the additional top electrode layer in the second region, serving as an etch mask. An etch, such as RIE, may be performed to pattern the additional top electrode layer using the patterned resist etch mask. In one embodiment, the etch removes exposed portions of the additional top electrode layer not protected by the etch mask, leaving a portion of the additional top electrode layer in the second region as shown in FIG. 6k. As shown, the remaining additional top electrode layer 169 is sufficiently wide to be electrically connected to the underlying MTJ stack in the second region while the additional top electrode layer in the first and third regions are completely removed. In such case, the remaining additional top electrode layer 169 disposed over the third upper dielectric layer may be referred to as an upper top electrode portion while the top electrode 166 having side surfaces aligned with side surfaces of upper MTJ stack layers 164c-164d may be referred to as a lower top electrode portion of the top electrode.

As shown in FIG. 6l, the process continues to form a fourth upper dielectric layer 692. The fourth upper dielectric layer, for example, includes a low-k dielectric material which is the same material as the second and third upper dielectric layers. The fourth upper dielectric layer may be formed by CVD and includes a thickness sufficient to cover the additional top electrode 169 in the second region. Other suitable dielectric materials and techniques may be used for forming the fourth upper dielectric layer. A planarization process is performed to remove excess fourth upper dielectric layer 692. The planarization process, for example, may be achieved by CMP. Other suitable techniques may also be useful. The planarization process produces a substantially planar top surface. As shown, the planarization process is performed until a top surface of the top electrode 169 is exposed in the second region as shown in FIG. 6l.

Referring to FIG. 6m, a fifth upper dielectric layer 694 is formed over the fourth upper dielectric layer 692 and covers the top electrode 169 in the second region. The fifth upper dielectric layer, for example, includes the same material and formed using the same technique such as that described with respect to the second, third and fourth upper dielectric layers. The fifth upper dielectric layer, for example, is sufficiently thick to accommodate a metal line or interconnect disposed in a metal level (e.g., M6) of the logic region. The third, fourth and fifth upper dielectric layers in combination, for example, may be referred to as a dielectric layer 190. The dielectric layer 190 and the second upper dielectric layer 150 in combination, for example, corresponds to upper ILD level 6.

In one embodiment, the process continues to form dual damascene opening having a trench and a via opening in the dielectric layer 190 in the first region and a damascene opening having a trench in the second region as shown in FIG. 6m. The dual damascene opening may be formed by via first or via last process. By way of example, a first removal process may be performed using suitable mask and etch technique to form a via opening 684 in the first region. The first removal process, for example, removes exposed portions of the dielectric liner 140, second, third, fourth and fifth upper dielectric layers and encapsulation liner 182 until a portion of the metal line 135a is exposed. A second removal process may be performed using suitable mask and etch technique to form second type trenches 685 in the first and second regions simultaneously. The trenches 685, for example, may be defined based on 2× design rule. The trenches may be formed by mask and etch techniques. The second removal process, for example, may employ an etch which is highly selective to the material of the fifth dielectric layer to remove exposed portions of the dielectric layer to form the trenches. As shown, the etch forms the trenches 685 in the first and second regions and stops when it reaches the top surface of the top electrode 169. Thus, the trenches in the first and second regions, for example, are formed by the same etch process. As shown, the trench 685 in the first region is in communication with the via opening 684 which is in communication with the metal line 135a while the trench 685 in the second region is in communication with the top electrode 169 as shown in FIG. 6m.

A conductive layer is formed. The conductive layer covers the dielectric layer 190 as well as filling the trenches and via opening. For example, the conductive layer fills both the trenches in the first and second regions and the via opening in the first region. The conductive layer should be sufficiently thick to fill the trenches and via opening. The conductive layer, for example, includes copper. Other suitable conductive materials may also be useful. Excess conductive material is removed by CMP, forming metal line 185a and top via contact 184 in the first region as well as metal line 185b in the second region as shown in FIG. 6m. As shown, the top surface of the metal lines is substantially planar with the top surface of the dielectric layer 190. The metal line and top via contact in the first region are formed by dual damascene process.

The process continues to complete formation of the IC. The process, for example, may continue to form passivation layer and pad interconnects or bonding pads. Further processing can include final passivation, dicing, assembly and packaging. Other processes are also useful.

Figure 7B:
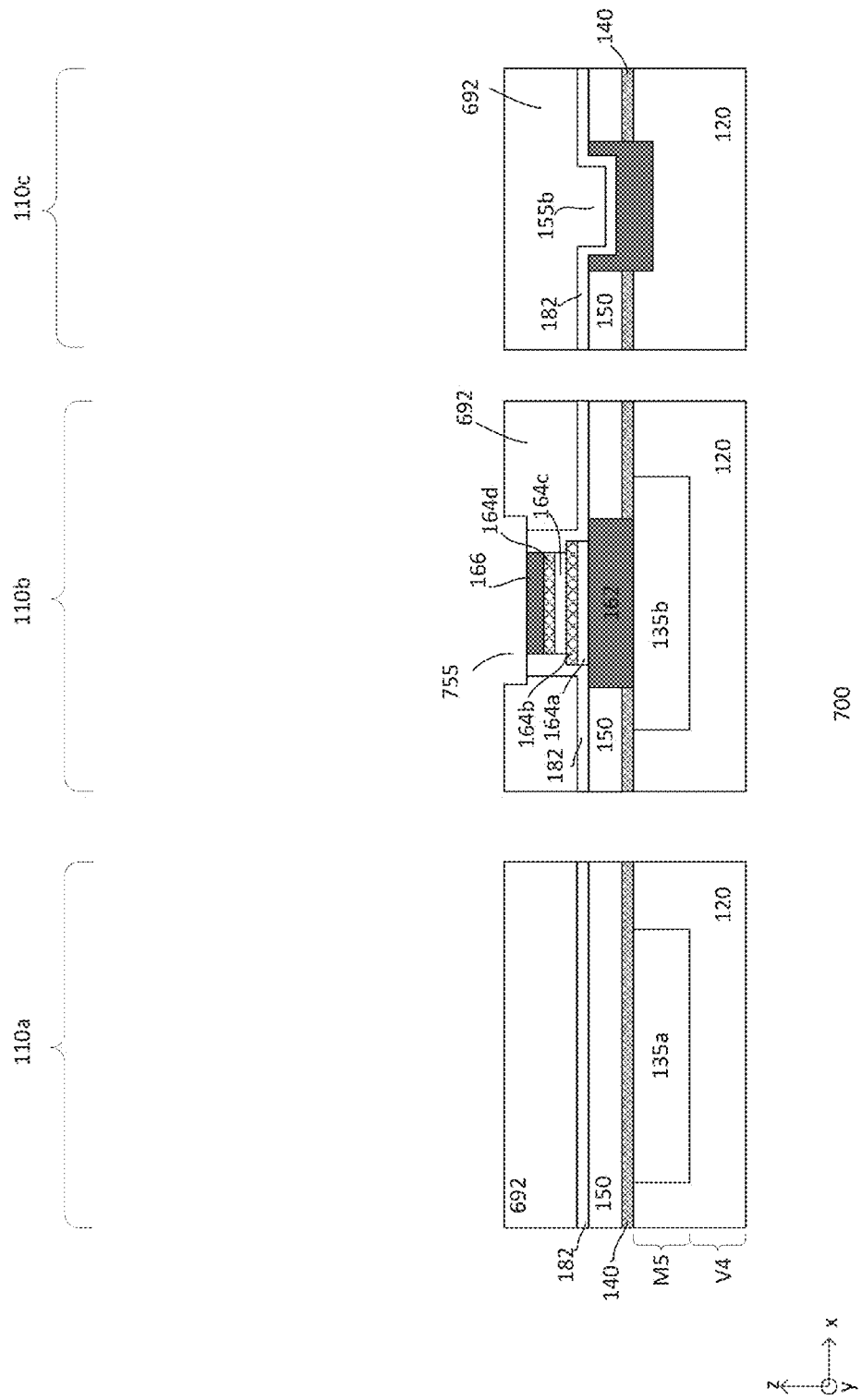

FIGS. 7a-7d show cross-sectional views of another embodiment of a process 700 for forming a device. The device formed by process 700 is the same or similar to the device 400 as described in FIGS. 4a-4b and the process 700 may contain similar steps as that described in FIGS. 6a-6m. In the interest of brevity, common elements may not be described or described in detail. As shown in FIG. 7a, the partially processed substrate is at the stage similar to that described in FIG. 6j. For example, a planarization process is performed to remove a top portion of the encapsulation liner 182 and hard mask 168 until a top surface of the top electrode 166 is exposed in the second region.

As described, the top electrode 166 and the MTJ stack may not be sufficiently thick to match the height of a via contact to be formed in the first (or logic) region. In such case, after the planarization process, the process 700, in one embodiment, continues to form a fourth upper dielectric layer 692. The fourth upper dielectric layer includes the same material and is formed by the same technique as that described in FIG. 6l.

In one embodiment, the fourth upper dielectric layer is patterned to form a trench opening 755 in the second region as shown in FIG. 7b. The trench opening, for example, exposes the top electrode 166 and a portion of the encapsulation liner 182. The opening may be formed by mask and etch techniques. For example, a patterned photoresist mask (not shown) may be formed over the fourth upper dielectric layer, serving as an etch mask. An etch, such as RIE, may be performed to pattern the fourth upper dielectric layer using the patterned resist etch mask. The trench opening, for example, should be sufficiently wide and deep to accommodate an additional top electrode 169 later.

The process 700 continues by forming an additional top electrode layer 669. The additional top electrode layer, for example, includes the same material and is formed by the same technique used for forming the top electrode 166. As shown in FIG. 7c, the additional top electrode layer is deposited over the first, second and third regions and fills the trench opening 755 in the second region. A planarization process is performed to remove excess top electrode layer 669. The planarization process, for example, may be achieved by CMP. Other suitable techniques may also be useful. The planarization process produces a substantially planar top surface in the second region and completely removes the additional top electrode layer from the first and third regions. As shown, the planarization process is performed until it reaches a top surface of the fourth upper dielectric layer 692 as shown in FIG. 7d. As shown, the planarization process defines the upper top electrode portion 169 having a top surface substantially coplanar with top surface of the fourth upper dielectric layer 692 in the second region. The top electrode, as shown, includes an upper top electrode portion 169 and a lower top electrode portion 166 which has side surfaces that are aligned with side surfaces of the upper layers of the MTJ stack.

The process 700 continues to form a fifth upper dielectric layer 694 and define top via contact and top metal lines 185a-185b. For example, the process 700 continues as similarly described in FIG. 6l and onwards. As such, these process steps will not be described or described in detail. The process continues until a device similar to that shown in FIGS. 4a-4b is formed.

Figure 8B:
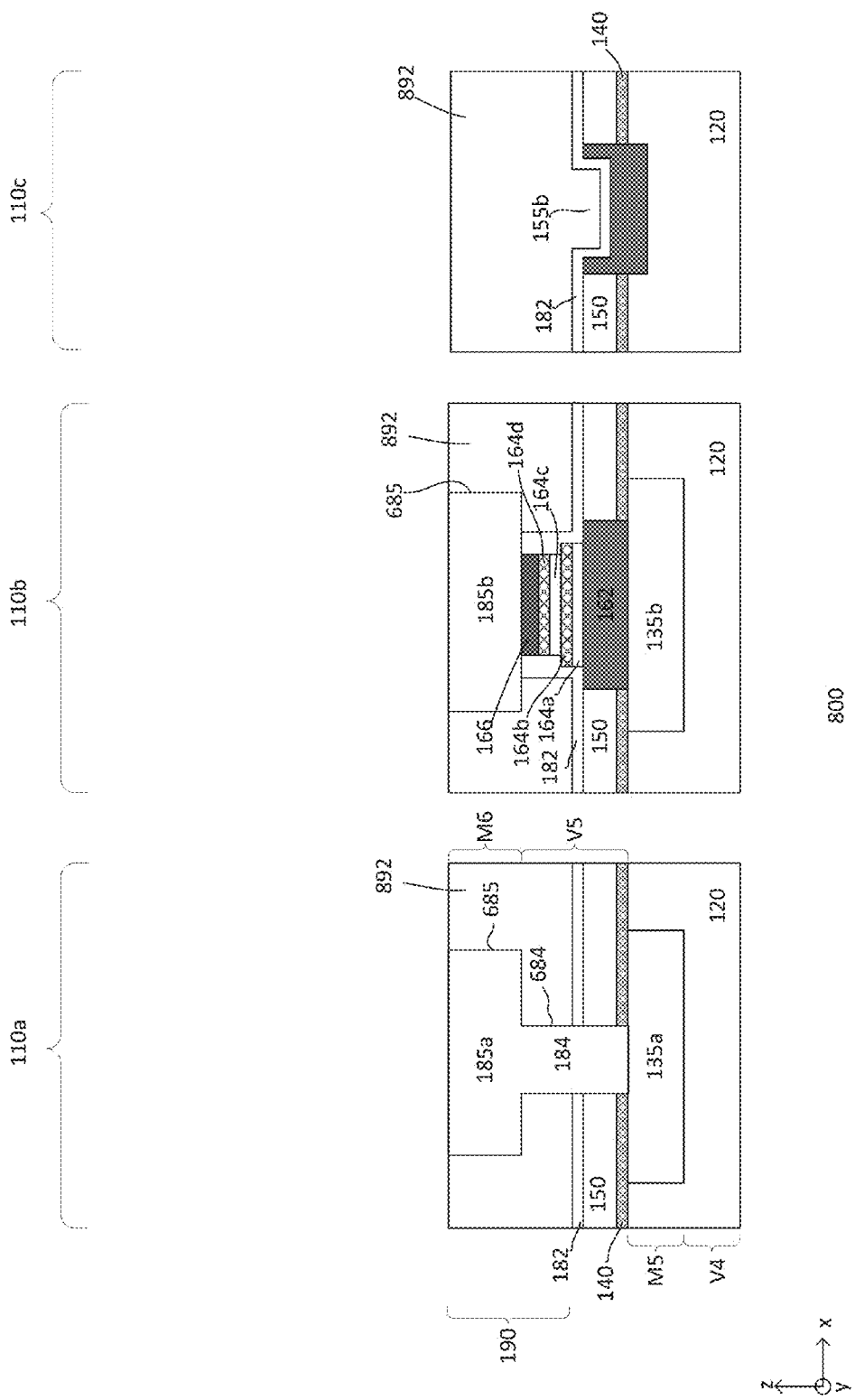

FIGS. 8a-8b show cross-sectional views of another embodiment of a process 800 for forming a device. The device formed by process 800 is the same or similar to the device 500 as described in FIGS. 5a-5b and the process 800 may contain similar steps as that described in FIGS. 6a-6m. In the interest of brevity, common elements may not be described or described in detail. As shown in FIG. 8a, the partially processed substrate is at the stage similar to that described in FIG. 6j. For example, a planarization process is performed to remove a top portion of the encapsulation liner 182 and hard mask 168 until a top surface of the top electrode 166 is exposed in the second region.

In one embodiment, the top electrode 166 and the MTJ stack 164 may be sufficiently thick to match the height of a via contact to be formed in the first (or logic) region. In such case, after the planarization process, the process 800, in one embodiments, continues to form a fourth upper dielectric layer 892 as shown in FIG. 8b. The fourth upper dielectric layer 892 includes the same material and is formed by the same technique described for the third dielectric layer 690. In one embodiment, the fourth upper dielectric layer 892 is sufficiently thick to accommodate a metal line or interconnect disposed in a metal level (e.g., M6) of the logic region which is based on 2× design rule. The third and fourth upper dielectric layers in combination, for example, may be referred to as a dielectric layer 190. The dielectric layer 190 and the second upper dielectric layer 150 in combination, for example, corresponds to upper ILD level 6.

In one embodiment, the process continues to form dual damascene opening having a trench and a via opening in the dielectric layer 190 in the first region and a damascene opening having a trench in the second region as shown in FIG. 8b. The dual damascene opening may be formed by via first or via last process. By way of example, a first removal process may be performed using suitable mask and etch technique to form a via opening 684 in the first region. The first removal process, for example, removes exposed portions of the dielectric liner 140, second, third and fourth upper dielectric layers and encapsulation liner 182 until a portion of the metal line 135a is exposed. A second removal process may be performed using suitable mask and etch technique to form second type trenches 685 in the first and second regions simultaneously. The trenches 685, for example, may be defined based on 2× design rule. The trenches may be formed by mask and etch techniques. The second removal process, for example, may employ an etch which is highly selective to the material of the fourth dielectric layer 892 to remove exposed portions of the dielectric layer to form the trenches. As shown, the etch forms the trenches 685 in the first and second regions and stops when it reaches the top surface of the top electrode 166. Thus, the trenches in the first and second regions, for example, are formed by the same etch process. As shown, the trench 685 in the first region is in communication with the via opening 684 which is in communication with the metal line 135a while the trench 685 in the second region is in communication with the top electrode 166 as shown in FIG. 8b.

A conductive layer is formed. The conductive layer covers the dielectric layer 190 as well as filling the trenches and via opening. For example, the conductive layer fills both the trenches in the first and second regions and the via opening in the first region. The conductive layer should be sufficiently thick to fill the trenches and via opening. The conductive layer, for example, includes copper. Other suitable conductive materials may also be useful. Excess conductive material is removed by CMP, forming metal line 185a and top via contact 184 in the first region as well as metal line 185b in the second region as shown in FIG. 8b. As shown, the top surface of the metal lines is substantially planar with the top surface of the dielectric layer 190. The metal line and top via contact in the first region are formed by dual damascene process.

The process continues to complete formation of the IC. The process, for example, may continue to form passivation layer and pad interconnects or bonding pads. Further processing can include final passivation, dicing, assembly and packaging. Other processes are also useful.

As described, the device includes one memory cell. However, it is understood that a device may include numerous memory cells integrated into the same IC. Although as described, the storage element is disposed in specified ILD level of the back end dielectric layer, other configurations may also be useful. For example, the storage element may be disposed in other suitable ILD level.

The embodiments as described in the present disclosure result in various advantages. The process as described is highly compatible with logic processing or technology. For example, memory cell is formed concurrently on the same substrate using logic processing without compromising the reliabilities of the memory cell and other components in the logic region on the same substrate. Moreover, the process as described is useful for integrating MRAM cell with logic components in low-k dielectric layers with minimal masks. The process as described can save the cost of several masks compared to conventional process. For example, the process as described eliminates the use of an alignment mask since the same mask for defining the trench for accommodating the bottom electrode of the storage element of the MRAM cell may be used to form an alignment trench which provides for adequate topography to serve as alignment mark. In some embodiments, in the case where the total thickness of the top electrode and the MTJ stack is sufficient to match the thickness of the via contact of the logic component in the same via level, a separate mask to define the upper top electrode portion may be avoided such as the process as described in FIGS. 8a-8b. Furthermore, the process as described also offers a simplified and cost saving solution as the MTJ stack is defined in a one-step etch process, using the dielectric spacers as the etch mask, further avoiding the use of separate etch mask to define the MTJ element. Thus, the process as described avoids investment of new tools and reduces the number of masks involved for integrating MRAM components with logic components. Additionally, the process allows for more compact MRAM cell to be formed as the bottom electrode may be embedded within the second upper dielectric layer and is in direct contact with the lower interconnect or metal line. As illustrated, the storage element is formed in between adjacent upper metal levels, such as in the via level between metal levels M5 and M6. The embodiments as described in this disclosure are flexible as the storage element of the MRAM cell may be disposed in between metal levels M3 and M4 or in between any other suitable adjacent metal levels with low-k dielectric layers where the height of the storage element substantially matches the height of the via contact of the logic region which is disposed in between these adjacent metal levels.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate defined with at least first, second and third regions, wherein the substrate includes a first interlevel dielectric (ILD) layer, the first ILD layer includes a first interconnect level with a first region metal line in the first region and a second region metal line in the second region;
   forming a first upper dielectric layer on the first ILD layer, wherein the first upper dielectric layer serves as a lower portion of a second via level of a second ILD layer above the first ILD layer;
   patterning the first upper dielectric layer to form a bottom electrode trench in the second region and an alignment trench in the third region, wherein
   the bottom electrode trench exposes the second region metal line, and
   the alignment trench has an alignment trench depth which is deeper than a bottom electrode trench depth of the bottom electrode trench, the alignment trench extends into the first interconnect level of the first ILD layer;
   forming a bottom electrode comprising a bottom electrode material in the bottom electrode trench and a bottom electrode alignment mark comprising the bottom electrode material in the alignment trench;
   forming a magnetic tunnel junction (MTJ) element with a top electrode on the bottom electrode; and
   forming a second upper dielectric layer over the first upper dielectric layer, wherein the second upper dielectric layer covers the MTJ element, the second upper dielectric layer serves as an upper portion of the via level of the second ILD layer.

2. The method of claim 1 wherein the first region is a logic region for accommodating at least one logic component, the second region is a memory cell region for accommodating the MRAM cell and the third region is a scribe lane of the device.

3. The method of claim 1 wherein:
   the first ILD layer, the first upper dielectric layer and the second upper dielectric layer comprise low-k dielectrics;
   forming the bottom electrode and the bottom electrode alignment mark comprises,
      depositing a bottom electrode layer on the substrate, the bottom electrode layer fills the bottom electrode trench while partially filling the alignment trench, and
      planarizing the substrate to form,
         the bottom electrode in the bottom electrode trench, wherein a top surface of the bottom electrode and a top surface of the first upper dielectric layer are coplanar, and
         the bottom electrode alignment mark in the alignment trench, wherein a profile of the alignment trench is transferred to the bottom electrode alignment mark to provide the bottom electrode alignment mark with a topography feature; and
   forming the second upper dielectric layer over the first upper dielectric layer also fills the topography feature of the bottom electrode alignment mark.

4. The method of claim 1 wherein:
   the first ILD layer, the first upper dielectric layer and the second upper dielectric layer comprise low-k dielectrics; and
   the second upper dielectric layer serves as an upper portion of the via level of the second ILD layer.

5. The method of claim 1 wherein forming the MTJ element comprises:
   forming layers of the MTJ element over the first, second and third regions;
   forming a top electrode layer and a hard mask layer over the layers of the MTJ element, wherein the top electrode layer and the layers of the MTJ element track a profile of the alignment trench in the third region; and
   patterning the top electrode layer and various layers of the MTJ element using the bottom electrode alignment mark with a topography feature which is visible from a top surface of the various layers of the MTJ element to align the patterned MTJ element to the bottom electrode.

6. The method of claim 5 wherein patterning the top electrode layer and layers of the MTJ element comprises:
   providing a mask over the top electrode layer; and
   performing an etch to remove exposed portions of the top electrode layer and upper layers of the MTJ element not protected by the mask in the second region and completely remove the top electrode and upper layers of the MTJ element from the first and third regions, wherein the patterned top electrode includes side surfaces which are aligned with side surfaces of the patterned upper layers of the MTJ element.

7. The method of claim 6 comprises:
   forming a dielectric liner over the first, second and third regions, wherein the dielectric liner covers exposed surfaces of the patterned top electrode and upper layers of the MTJ element in the second region; and
   performing a blanket anisotropic etch process to remove horizontal portions of the dielectric liner, leaving vertical portions as dielectric spacers lining sidewalls of the patterned top electrode and the patterned upper layers of the MTJ element.

8. The method of claim 7 comprises:
   performing an etch process to define lower layers of the MTJ element in the second region while completely removing the lower layers of the MTJ element in the first and third regions; and
   wherein the dielectric spacers serve as an etch mask and the lower layers of the MTJ element are defined such that a length of the lower layers of the MTJ element is greater than a length of the upper layers of the MTJ element.

9. The method of claim 8 comprising forming an encapsulation liner over the first, second and third regions, wherein the encapsulation liner also covers the patterned top electrode and MTJ element and wherein the encapsulation liner and the dielectric spacers comprise nBLOK.

10. The method of claim 9 comprising:
    forming a second upper dielectric layer over the first, second and third regions;

performing a planarization process to until a top surface of the top electrode is exposed; and the top surface of the top electrode and the second upper dielectric layer are coplanar.

11. The method of claim 10 comprises:

forming an additional top electrode which is directly coupled and in contact with the top electrode;

forming a third upper dielectric layer on the substrate, the third upper dielectric layer sufficiently covers the additional top electrode;

planarizing the third upper dielectric layer to expose the additional top electrode, wherein the additional top electrode and third upper dielectric layer are coplanar; and wherein the first, second and third upper dielectric layers serve as the second via level of the second ILD layer.

12. The method of claim 10 comprises:

forming an additional top electrode layer over the first, second and third regions; and patterning the additional top electrode layer to form an additional top electrode in the second region which is electrically connected to the underlying top electrode of the MTJ element in the second region while the additional top electrode layer in the first and third regions are completely removed, wherein the additional top electrode layer in the second region corresponds to an upper top electrode portion while the top electrode having side surfaces aligned with side surfaces of the patterned upper layers of the MTJ element corresponds to a lower top electrode portion of the top electrode.

13. The method of claim 10 comprises:

forming a third upper dielectric layer on the substrate, the third upper dielectric layer sufficiently covers the top electrode;

patterning the third upper dielectric layer to form a top electrode trench which exposes an additional top electrode;

forming an additional top electrode layer on the substrate, filling the top electrode trench and covering the third upper dielectric layer;

planarizing the additional top electrode layer to form an additional top electrode in the top electrode trench; and wherein the first, second and third upper dielectric layers serve as the second via level of the second ILD layer.

14. The method of claim 13 comprising:

forming a fourth upper dielectric layer over the first, second and third regions;

patterning the fourth upper dielectric layer to form a line trench opening in the second region, wherein the line trench opening exposes the additional top electrode;

forming a conductive line layer on the fourth upper dielectric layer over the first, second and third regions, wherein the conductive line layer fills the line trench opening in the second region; and performing a planarization process to remove excess conductive line layer to form a conductive line coupled to the additional top electrode.

15. The method of claim 10 comprising:

forming a third upper dielectric layer over the first, second and third regions;

patterning the third upper dielectric layer to form a line trench opening in the second region, wherein the line trench opening exposes the top electrode;

forming a conductive line layer on the third upper dielectric layer over the first, second and third regions, wherein the conductive line layer fills the line trench opening in the second region; and performing a planarization process to remove excess conductive line layer to form a conductive line coupled to the additional top electrode.

16. A method of forming a device comprising:

providing a substrate defined with at least first, second and third regions;

forming a first upper dielectric layer over the first, second and third regions of the substrate, wherein the first upper dielectric layer comprises a first upper interconnect level with a plurality of metal lines in the first and second regions, wherein the first upper interconnect level serves as a first interlevel dielectric (ILD) layer forming a second upper dielectric layer over the first, second and third regions covering the first upper dielectric layer; wherein forming the second upper dielectric layer comprises patterning the second upper dielectric layer to simultaneously form a first trench opening extending from a top surface of the second upper dielectric layer to a top surface of the metal line in the second region, a second trench opening corresponding to an alignment trench which extends from the top surface of the second upper dielectric layer into a portion of the first upper dielectric layer in the third region, and wherein the second upper dielectric layer serves as a lower portion of a second ILD layer above the first ILD layer;

forming a bottom electrode layer over the second upper dielectric layer and fills the first trench opening and partially fills the second trench opening, wherein the bottom electrode layer is planarized to remove excess bottom electrode layer to define a bottom electrode that is in direct contact with the metal line in the first upper interconnect level in the first trench opening, and a bottom electrode alignment mark in the second trench opening, wherein a profile of the second trench opening is transferred to the bottom electrode alignment mark to provide the bottom electrode alignment mark with a topography feature which is visible from top surface of the substrate;

forming a magnetic random access memory (MRAM) cell in the second region, wherein the MRAM cell comprises a magnetic tunnel junction (MTJ) element sandwiched between a top and the bottom electrodes; and forming a dielectric layer over the first, second and third regions and covering the second upper dielectric layer and MRAM cell, wherein the dielectric layer comprises interconnects in the first and second regions, wherein the interconnect in the second region is coupled to the MTJ element.

17. The method of claim 16 wherein the interconnects in the first and second regions comprises:

a dual damascene interconnect in the first region, wherein the dual damascene interconnect in the first region is formed over and is coupled to the metal line in the first region; and a damascene interconnect in the second region, wherein the damascene interconnect in the second region is coupled to the MTJ element.

18. The method of claim 17 wherein forming the magnetic random access memory (MRAM) cell in the second region comprises:

forming layers of the MTJ element over the first, second and third regions;

forming a top electrode layer and a hard mask layer over the layers of the MTJ element, wherein the top electrode layer and the layers of the MTJ element track a profile of the alignment trench in the third region; and patterning the top electrode layer and layers of the MTJ element using the topography feature which is visible from top surface of the layers of the MTJ element to align the patterned MTJ element to the bottom electrode.

19. The method of claim 17 wherein forming the dielectric layer over the first, second and third regions and covering the second upper dielectric layer comprises:

forming a third upper dielectric layer over the first, second and third regions and covering the second upper dielectric layer, wherein the third upper dielectric layer is planarized to expose a top surface of the top electrode;

forming an additional top electrode layer over the first, second and third regions and covering the third upper dielectric layer; and patterning the additional top electrode layer to form an additional top electrode in the second region which is electrically connected to the underlying top electrode of the MTJ element in the second region while the additional top electrode layer in the first and third regions are completely removed, wherein the additional top electrode layer in the second region corresponds to an upper top electrode portion while the top electrode having side surfaces aligned with side surfaces of the patterned upper layers of the MTJ element corresponds to a lower top electrode portion of the top electrode.

20. The method of claim 17 wherein forming the dielectric layer over the first, second and third regions and covering the second upper dielectric layer comprises:

forming a third upper dielectric layer over the first, second and third regions and covering the second upper dielectric layer, wherein the third upper dielectric layer is planarized to expose a top surface of the top electrode;

forming a fourth upper dielectric layer over the first, second and third regions and covering the third upper dielectric layer, wherein the fourth dielectric layer comprises a trench opening in the second region;

forming an additional top electrode layer over the first, second and third regions over the fourth upper dielectric layer, wherein the additional top electrode layer fills the trench opening in the second region; and performing a planarization process to remove excess additional top electrode layer and define an upper top electrode portion while the top electrode having side surfaces aligned with side surfaces of the patterned upper layers of the MTJ element corresponds to a lower top electrode portion of the top electrode.

* * * * *